(12) United States Patent
Li et al.

(10) Patent No.: US 11,895,879 B2
(45) Date of Patent: Feb. 6, 2024

(54) DISPLAY SUBSTRATE AND PREPARATION METHOD THEREOF, AND DISPLAY APPARATUS

(71) Applicants: Hefei BOE Joint Technology Co., Ltd., Anhui (CN); BOE Technology Group Co., Ltd., Beijing (CN)

(72) Inventors: Meng Li, Beijing (CN); Yongqian Li, Beijing (CN); Ying Wang, Beijing (CN)

(73) Assignees: Hefei BOE Joint Technology Co., Ltd., Hefei (CN); BOE Technology Group Co., Ltd., Beijing (CN)

(*) Notice: Subject to any disclaimer, the term of this patent is extended or adjusted under 35 U.S.C. 154(b) by 551 days.

(21) Appl. No.: 17/266,085

(22) PCT Filed: May 15, 2020

(86) PCT No.: PCT/CN2020/090558
§ 371 (c)(1),
(2) Date: Feb. 4, 2021

(87) PCT Pub. No.: WO2021/227029
PCT Pub. Date: Nov. 18, 2021

(65) Prior Publication Data
US 2022/0115483 A1    Apr. 14, 2022

(51) Int. Cl.
| | | |
|---|---|---|
| H01L 27/32 | (2006.01) | |
| H10K 59/131 | (2023.01) | |
| H10K 50/824 | (2023.01) | |
| H10K 59/126 | (2023.01) | |
| H10K 59/121 | (2023.01) | |
| H10K 71/00 | (2023.01) | |

(Continued)

(52) U.S. Cl.
CPC ......... *H10K 59/131* (2023.02); *H10K 50/824* (2023.02); *H10K 59/126* (2023.02); *H10K 59/1213* (2023.02); *H10K 71/00* (2023.02); *H01L 27/124* (2013.01); *H10K 59/1201* (2023.02)

(58) Field of Classification Search
CPC .............. H10K 59/131; H10K 50/824; H10K 59/1213; H10K 59/126; H10K 71/00; H10K 59/1201; H10K 59/351; H01L 27/124; H01L 27/1255
See application file for complete search history.

(56) References Cited

U.S. PATENT DOCUMENTS

2018/0158406 A1* 6/2018 Kim ..................... G09G 3/3283
2020/0013849 A1* 1/2020 Kim ..................... H10K 59/123

* cited by examiner

*Primary Examiner* — Mohammed R Alam
(74) *Attorney, Agent, or Firm* — Ling Wu; Stephen Yang; Ling and Yang Intellectual Property

(57) ABSTRACT

Provided are a display substrate and a preparation method thereof, and a display apparatus. The display substrate includes a plurality of display units. The display unit includes a display area and a transparent area. The display area includes a plurality of sub-pixels. In a direction perpendicular to the display substrate, the sub-pixel includes a first metal layer, a semiconductor layer, a second metal layer and a third metal layer which are arranged on a substrate. The first metal layer includes a first plate, the semiconductor layer includes a second plate, the second metal layer includes a first scanning line and a second scanning line, and the third metal layer includes a third plate, a first power supply line, a second power supply line, a compensation line and a data line.

20 Claims, 11 Drawing Sheets

(51) Int. Cl.
*H01L 27/12* (2006.01)
*H10K 59/12* (2023.01)

DISPLAY SUBSTRATE AND PREPARATION METHOD THEREOF, AND DISPLAY APPARATUS

TECHNICAL FIELD

The present disclosure relates to, but is not limited to, the field of display technology, in particular to a display substrate and a preparation method thereof, and a display apparatus.

BACKGROUND

An Organic Light Emitting Diode (OLED) is an active light emitting display device, and has the advantages of light emission, ultra-thinness, a wide viewing angle, high brightness, a high contrast, low power consumption, an extremely high response speed, etc. With the continuous development of display technology, OLED technology is increasingly used in flexible display apparatuses, and has gradually become a next generation display technology with great development prospects. According to different driving modes, OLEDs may be divided into two types, Passive Matrix (PM) type and Active Matrix (AM) type. An AMOLED is a current-driven device, in which an independent Thin Film Transistor (TFT) is used to control each sub-pixel, and each sub-pixel may be continuously and independently driven to emit light.

With the continuous development of display technology, the OLED technology is increasingly used in transparent display. Transparent display is an important personalized display field of display technology, which refers to display of images in a transparent state, so that a viewer can see not only images in a display apparatus, but also scenes behind the display apparatus, and can realize Virtual Reality (VR) and Augmented Reality (AR) and 3D display functions. In a transparent display apparatus using the AMOLED technology, each pixel is generally divided into a display area and a transparent area. In the display area, a pixel driving circuit and a light emitting element are arranged to realize image display, and the transparent area allows light to pass through.

SUMMARY

The following is a summary of subject matter described in detail herein. This summary is not intended to limit the protection scope of the claims.

In a first aspect, the present disclosure provides a display substrate, including a plurality of display units, the display unit including a display area and a transparent area, the display area including a plurality of sub-pixels; in a direction perpendicular to the display substrate, the sub-pixel including a first metal layer, a semiconductor layer, a second metal layer and a third metal layer which are arranged on a substrate, the first metal layer including a first plate, the semiconductor layer including a second plate, the second metal layer including a first scanning line and a second scanning line which define a sub-pixel row, and the third metal layer including a third plate, and a first power supply line, a second power supply line, a compensation line and a data line which define the plurality of sub-pixels; there being an overlapping area between an orthographic projection of the second plate on the substrate and an orthographic projection of the first plate on the substrate to form a first storage capacitor, there being an overlapping area between an orthographic projection of the third plate on the substrate and an orthographic projection of the second plate on the substrate to form a second storage capacitor, the third plate being connected with the first plate through a via hole; and the third metal layer further including at least one auxiliary cathode which is arranged in the transparent area and connected with the second power supply line.

In some possible implementations, the display area includes a first sub-pixel, a second sub-pixel, a third sub-pixel and a fourth sub-pixel which are provided with a pixel driving circuit, and the four sub-pixels are arranged in parallel.

In some possible implementations, at least one of the first metal layers and the semiconductor layers of the first sub-pixel and the fourth sub-pixel are mirror symmetrically arranged with respect to the compensation line, and at least one of the first metal layers and the semiconductor layers of the second sub-pixel and the third sub-pixel are mirror symmetrically arranged with respect to the compensation line.

In some possible implementations, the pixel driving circuit includes a first transistor, a second transistor, a third transistor and a storage capacitor. A gate electrode of the first transistor is connected with the first scanning line, a first electrode of the first transistor is connected with the data line, a second electrode of the first transistor is connected with a gate electrode of the second transistor, a first electrode of the second transistor is connected with the first power supply line, a second electrode of the second transistor is connected with a first electrode of an organic electroluminescent diode, a gate electrode of the third transistor is connected with the second scanning line, a first electrode of the third transistor is connected with the compensation line through a compensation connection line, a second electrode of the third transistor is connected with the second electrode of the second transistor, a second electrode of the organic electroluminescent diode is connected with the second power supply line, the first plate and the third plate are connected with the second electrode of the second transistor, and the second plate is connected with the gate electrode of the second transistor.

In some possible implementations, the pixel driving circuit further includes a power supply connection line, the first electrode of the second transistor is connected with the first power supply line through the power supply connection line; the power supply connection line is arranged on the same layer as the first scanning line and the second scanning line, and the first power supply line is connected with the power supply connection line through a via hole, to form a double-layer routing between the gate electrode of the first transistor and the gate electrode of the third transistor.

In some possible implementations, the pixel driving circuit further includes an auxiliary power supply line which is arranged on the same layer as the first scanning line and the second scanning line, and the second power supply line is connected with the auxiliary power supply line through a via hole, to form a double-layer routing between the gate electrode of the first transistor and the gate electrode of the third transistor.

In some possible implementations, the semiconductor layer further includes an active layer of the first transistor, an active layer of the second transistor and an active layer of the third transistor. The compensation connection line is arranged on the same layer as the first plate, and the second plate is arranged on the same layer as the active layer of the first transistor, the active layer of the second transistor and the active layer of the third transistor.

In some possible implementations, the first plate serves as a shielding layer, and a shape of the first plate includes an elongated rectangular shape. In a direction parallel to the compensation line, a length of the first plate is greater than a distance between the gate electrode of the first transistor and the gate electrode of the third transistor.

In some possible implementations, the auxiliary cathode includes an electrode block and a connection strip, the electrode block is connected with the second power supply line through the connection strip, and an area of the electrode block is 5% to 20% of an area of the transparent area.

In some possible implementations, in a plane parallel to the display substrate, the shape of the electrode block includes any one or more of a circle, an ellipse, a rectangle, a trapezoid, a pentagon, a hexagon and a dumbbell shape, and the connection strip includes any one or more of a straight strip, a zigzag strip and an arcuate strip.

In some possible implementations, the display substrate further includes a shielding strip, and an orthographic projection of the shielding strip on the substrate includes orthographic projections of the first scanning line, the second scanning line, the first power supply line and the second power supply line on the substrate.

In some possible implementations, the display substrate further includes a convex structure, and the convex structure is arranged on an inner side of an edge of the transparent area and includes a wavy shielding strip or a plurality of spaced-apart protrusions, to form a transparent area with a concave-convex inside edge or a transparent area with a wavy inside edge.

In some possible implementations, in a plane parallel to the display substrate, the shape of the protrusions includes any one or more of a circle, an ellipse, a rectangle, a trapezoid, a pentagon, a hexagon and a dumbbell shape.

In some possible implementations, the convex structure is arranged on the same layer as the shielding strip.

In another aspect, the present disclosure further provides a method for preparing a display substrate, the display substrate including a plurality of display units, the display unit including a display area and a transparent area, and the display area including a plurality of sub-pixels; the method including:

forming a first metal layer, a semiconductor layer and a second metal layer on a substrate; the first metal layer including a first plate, the semiconductor layer including a second plate, there being an overlapping area between an orthographic projection of the second plate on the substrate and an orthographic projection of the first plate on the substrate to form a first storage capacitor; the second metal layer including a first scanning line and a second scanning line which define a sub-pixel row;

forming a third metal layer; the third metal layer including a third plate, and a first power supply line, a second power supply line, a compensation line and a data line which define the plurality of sub-pixels; there being an overlapping area between an orthographic projection of the third plate on the substrate and an orthographic projection of the second plate on the substrate to form a second storage capacitor, the third plate being connected with the first plate through a via hole; and the third metal layer further including at least one auxiliary cathode which is arranged in the transparent area and connected with the second power supply line.

In some possible implementations, forming a first metal layer, a semiconductor layer and a second metal layer sequentially on a substrate includes:

forming a first metal layer including a first plate and a compensation connection line on the substrate; forming a first insulating layer covering the first metal layer, and forming a semiconductor layer including a second plate on the first insulating layer, there being an overlapping area between an orthographic projection of the second plate on the substrate and an orthographic projection of the first plate on the substrate to form a first storage capacitor; and forming a second insulating layer and a second metal layer arranged on the second insulating layer, the second insulating layer having the same pattern as the second metal layer, and the second metal layer including a first scanning line, a second scanning line and a power supply connection line.

In some possible implementations, the forming a third metal layer includes: forming a third insulating layer covering the second metal layer, the third insulating layer being formed with a plurality of via holes including: a seventh via hole exposing the compensation connection line, a tenth via hole exposing the first plate and an eleventh via hole exposing the power supply connection line; and forming a third metal layer on the third insulating layer, the third metal layer including a third plate, a first power supply line, a second power supply line, a compensation line, a data line and at least one auxiliary cathode; there being an overlapping area between an orthographic projection of the third plate on the substrate and an orthographic projection of the second plate on the substrate to form a second storage capacitor, the third plate being connected with the first plate through the tenth via hole; the compensation line being connected with the compensation connection line through the seventh via hole, and the first power supply line being connected with the power supply connection line through the eleventh via hole; and the at least one auxiliary cathode being arranged in the transparent area and connected with the second power supply line.

In some possible implementations, the preparation method further includes: forming a fourth insulating layer and a flat layer covering the third metal layer; forming an anode and a connection electrode on the flat layer, the anode being connected with the third plate, and the connection electrode being connected with the auxiliary cathode; sequentially forming a pixel define layer, an organic light emitting layer, a cathode and an encapsulation layer, the cathode being connected with the connection electrode; and forming a shielding strip on the encapsulation layer, an orthographic projection of the shielding strip on the substrate including orthographic projections of the first scanning line, the second scanning line, the first power supply line and the second power supply line on the substrate.

In some possible implementations, the forming a shielding strip on the encapsulation layer includes: forming a shielding strip and a convex structure on the encapsulation layer, the convex structure being arranged on an inner side of an edge of the transparent area and including a wavy shielding strip or a plurality of spaced-apart protrusions, to form a transparent area with a concave-convex inside edge or a transparent area with a wavy inside edge.

In a further aspect, the present disclosure also provides a display apparatus, including the display substrate described above.

Other aspects will become apparent upon reading and understanding the accompanying drawings and the detailed description.

BRIEF DESCRIPTION OF DRAWINGS

The accompanying drawings are used to provide a further understanding of the technical solutions of the present disclosure and form a part of the specification. Together with the embodiments of the present disclosure, they are used to explain the technical solutions of the present disclosure and do not constitute a limitation on the technical solutions of the present disclosure. The shapes and dimensions of the components in the drawings do not reflect real proportions, and are only for the purpose of schematically illustrating contents of the present disclosure.

DESCRIPTION OF REFERENCE SIGNS

Figure 1:
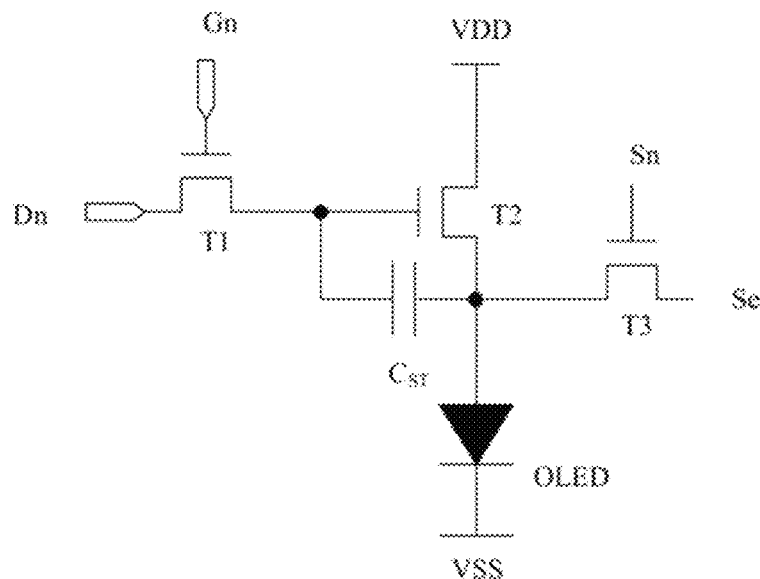
FIG. 1 is an equivalent circuit diagram of a pixel driving circuit according to the present disclosure.

1—display unit; 10—substrate; 11—first active layer; 12—first gate electrode; 13—first source electrode; 14—first drain electrode; 21—second active layer; 22—second gate electrode; 23—third source electrode; 24—second drain electrode; 31—third active layer; 32—third gate electrode; 33—third source electrode; 34—third drain electrode; 41—first plate; 42—second plate; 43—third plate; 51—compensation connection line; 52—power supply connection line; 53—auxiliary power supply line; 61—first insulating layer; 62—second insulating layer; 63—third insulating layer; 64—fourth insulating layer; 65—flat layer; 70—anode; 71—pixel define layer; 72—organic light emitting layer; 73—cathode; 74—first encapsulation layer; 75—second encapsulation layer; 76—third encapsulation layer; 80—auxiliary cathode; 90—shielding strip; 91—convex structure; 100—display area; and 200—transparent area.

DETAILED DESCRIPTION

To make the objects, technical solutions and advantages of the present disclosure more clear, embodiments of the present disclosure will be described in detail below with reference to the accompanying drawings. The embodiments may be implemented in a number of different forms. A person of ordinary skills in the art will readily understand the fact that implementations and contents may be transformed into a variety of forms without departing from the spirit and scope of the present disclosure. Therefore, the present disclosure should not be construed as being limited only to what is described in the following embodiments. Without conflict, embodiments in the present disclosure and features in the embodiments may be combined with each other arbitrarily.

In the drawings, the size of a constituent element, or the thickness or area of a layer, is sometimes exaggerated for clarity. Therefore, an implementation of the present disclosure is not necessarily limited to the size shown, and the shapes and sizes of the components in the drawings do not reflect true proportions. In addition, the drawings schematically show ideal examples, and an implementation of the present disclosure is not limited to the shapes or values shown in the drawings.

The ordinal numbers such as "first", "second" and "third" in the specification are used to avoid confusion of constituent elements, but not to limit in quantity.

In this specification, for convenience, words and phrases indicating an orientation or positional relationship, such as "middle", "upper", "lower", "front", "rear", "vertical", "horizontal", "top", "bottom", "inner" and "outer", are used to describe the positional relationship of constituent elements with reference to the drawings, which are only for the convenience of describing the present specification and simplifying the description, rather than indicating or implying that the apparatus or element referred to must have the specific orientation, or be constructed and operated in the specific orientation, and thus cannot be interpreted as a limitation on the present disclosure. The positional relationship of the constituent elements is appropriately changed according to the direction in which each constituent element is described. Therefore, the words and phrases are not limited to those described in the specification, but may be replaced as appropriate according to the situation.

In this specification, unless otherwise clearly specified or defined, the terms "install", "connect" and "link" should be broadly interpreted, which, for example, may be fixed connection, detachable connection, or integral connection; may be a mechanical connection or an electrical connection; and may be direct connection, indirect connection through an intermediary, or an internal connection between two elements. For a person of ordinary skills in the art, the specific meanings of the above terms in the present disclosure may be understood according to a specific situation.

In this specification, a transistor refers to an element including at least three terminals, namely a gate electrode, a drain electrode and a source electrode. The transistor has a channel region between the drain electrode (a drain terminal, a drain region or a drain electrode) and the source electrode (a source electrode terminal, a source region or a source electrode), and current can flow through the drain electrode, the channel region and the source electrode. In this specification, the channel region refers to a region through which current mainly flows.

In this specification, it may be the case that a first electrode is a drain electrode and a second electrode is a source electrode, and it may also be the case that a first electrode is a source electrode and a second electrode is a drain electrode. In a case where transistors with opposite polarities are used or the direction of current changes during circuit operation, the functions of the "source electrode" and the "drain electrode" are sometimes interchanged. Therefore, in this specification, "source electrode" and "drain electrode" may be interchanged.

In this specification, "electrical connection" includes a case where the constituent elements are connected together by an element having a certain electrical function. The "element having a certain electrical function" is not particularly limited as long as it can transmit and receive electrical signals between connected components. Examples of the "element having a certain electrical function" not only include electrodes and wirings, but also include switching elements such as transistors, resistors, inductors, capacitors, and other elements with various functions.

In this specification, "parallel" refers to a state in which an angle formed by two straight lines is –10 degrees or more and 10 degrees or less, and thus also includes a state in which the angle is –5 degrees or more and 5 degrees or less. In addition, "vertical" refers to a state in which an angle formed by two straight lines is 80 degrees or more and 100 degrees or less, and thus also includes a state of an angle of 85 degrees or more and 95 degrees or less.

In this specification, "film" and "layer" can be interchanged. For example, "conductive layer" can sometimes be replaced by "conductive film". Similarly, "insulating film" can sometimes be replaced by "insulating layer".

The display substrate according to the present disclosure includes a plurality of display units which are regularly arranged. The display unit includes a display area and a transparent area. The display area is configured to achieve image display, and the transparent area is configured to allow light to pass through. The display area includes a plurality of sub-pixels. In a direction perpendicular to the display substrate, the sub-pixel includes a first metal layer, a semiconductor layer, a second metal layer and a third metal layer which are arranged on a substrate. The first metal layer includes a first plate, the semiconductor layer includes a second plate, the second metal layer includes a first scanning line and a second scanning line which define a sub-pixel row, and the third metal layer includes a third plate, and a first power supply line, a second power supply line, a compensation line and data lines which define the plurality of sub-pixels. There is an overlapping area between an orthographic projection of the second plate on the substrate and an orthographic projection of the first plate on the substrate to form a first storage capacitor, and there is an overlapping area between an orthographic projection of the third plate on the substrate and an orthographic projection of the second plate on the substrate to form a second storage capacitor. The third plate is connected with the first plate through a via hole. The third metal layer further includes at least one auxiliary cathode. The at least one auxiliary cathode is arranged in the transparent area, is configured to reduce diffraction effect of the transparent area, and is connected with the second power supply line.

In an exemplary embodiment, the display area includes a first sub-pixel, a second sub-pixel, a third sub-pixel and a fourth sub-pixel which are provided with a pixel driving circuit, and the four sub-pixels are arranged in parallel.

In an exemplary embodiment, at least one of the first metal layers and the semiconductor layers of the first sub-pixel and the fourth sub-pixel are mirror symmetrically arranged with respect to the compensation line, and at least one of the first metal layers and the semiconductor layers of the second sub-pixel and the third sub-pixel are mirror symmetrically arranged with respect to the compensation line.

In an exemplary embodiment, the pixel driving circuit includes a first transistor, a second transistor, a third transistor and a storage capacitor. A gate electrode of the first transistor is connected with the first scanning line, a first electrode of the first transistor is connected with the data line, a second electrode of the first transistor is connected with a gate electrode of the second transistor, a first electrode of the second transistor is connected with the first power supply line, a second electrode of the second transistor is connected with a first electrode of an organic electroluminescent diode, a gate electrode of the third transistor is connected with the second scanning line, a first electrode of the third transistor is connected with the compensation line through a compensation connection line, a second electrode of the third transistor is connected with the second electrode of the second transistor, a second electrode of the organic electroluminescent diode is connected with the second power supply line, the first plate and the third plate are connected with the second electrode of the second transistor, and the second plate is connected with the gate electrode of the second transistor.

In an exemplary embodiment, the pixel driving circuit further includes a power supply connection line, the first electrode of the second transistor is connected with the first power supply line through the power supply connection line; the power supply connection line is arranged on the same layer as the first scanning line and the second scanning line, and the first power supply line is connected with the power supply connection line through a via hole, to form a double-layer routing between the gate electrode of the first transistor and the gate electrode of the third transistor.

In an exemplary embodiment, the pixel driving circuit further includes an auxiliary power supply line which is arranged on the same layer as the first scanning line and the second scanning line, and the second power supply line is connected with the auxiliary power supply line through a via hole, to form a double-layer routing between the gate electrode of the first transistor and the gate electrode of the third transistor.

In an exemplary embodiment, the compensation connection line is arranged on the same layer as the first plate, and the second plate is arranged on the same layer as the active layer of the first transistor, the active layer of the second transistor and the active layer of the third transistor.

In an exemplary embodiment, the first plate serves as a shielding layer, and a shape of the first plate includes an elongated rectangular shape. In a direction parallel to the compensation line, a length of the first plate is greater than a distance between the gate electrode of the first transistor and the gate electrode of the third transistor.

In an exemplary embodiment, the auxiliary cathode includes an electrode block and a connection strip, the electrode block is connected with the second power supply line through the connection strip, and an area of the electrode block is 5% to 20% of an area of the transparent area.

In an exemplary embodiment, in a plane parallel to the display substrate, the shape of the electrode block includes any one or more of a circle, an ellipse, a rectangle, a trapezoid, a pentagon, a hexagon and a dumbbell shape, and the connection strip includes any one or more of a straight strip, a zigzag strip and an arcuate strip.

In an exemplary embodiment, the display substrate further includes a shielding strip which is arranged at an edge of the display area, at an edge of the transparent area, or at edges of the display area and the transparent area, and an orthographic projection of the shielding strip on the substrate includes orthographic projections of the first scanning line, the second scanning line, the first power supply line and the second power supply line on the substrate.

In an exemplary embodiment, the display substrate further includes a convex structure, and the convex structure is arranged on an inner side of an edge of the transparent area and includes a wavy shielding strip or a plurality of spaced-apart protrusions, to form a transparent area with a concave-convex inside edge or a transparent area with a wavy inside edge.

In an exemplary embodiment, the shape of the protrusion includes any one or more of a circle, an ellipse, a rectangle, a trapezoid, a pentagon, a hexagon and a dumbbell shape.

In an exemplary embodiment, the convex structure is arranged on the same layer as the shielding strip.

In an exemplary embodiment, the display area includes three or four sub-pixels provided with a pixel driving circuit, and the pixel driving circuit of each sub-pixel is configured to be connected with an organic electroluminescent diode. FIG. 1 is an equivalent circuit diagram of a pixel driving circuit according to the present disclosure. As shown in FIG. 1, the pixel driving circuit includes a first transistor T1, a second transistor T2, a third transistor T3 and a storage capacitor $C_{ST}$, and the light emitting element is an OLED. The first transistor T1 is a switching transistor, the second transistor T2 is a driving transistor, and the third transistor T3 is a compensation transistor. A gate electrode of the first transistor T1 is connected with the first scanning line Gn, a first electrode of the first transistor T1 is connected with the data line Dn, and a second electrode of the first transistor T1 is connected with a gate electrode of the second transistor T2. The first transistor T1 is used for receiving, under the control of the first scanning line Gn, a data signal transmitted by the data line Dn, so that the gate electrode of the second transistor T2 receives the data signal. The gate electrode of the second transistor T2 is connected with the second electrode of the first transistor T1, a first electrode of the second transistor T2 is connected with the first power supply line VDD, and a second electrode of the second transistor T2 is connected with a first electrode of the OLED. The second transistor T2 is used for generating, under the control of the data signal received by the gate electrode thereof, corresponding current in the second electrode. A gate electrode of the third transistor T3 is connected with the second scanning line Sn, a first electrode of the third transistor T3 is connected with the compensation line Se, and a second electrode of the third transistor T3 is connected with the second electrode of the second transistor T2. The third transistor T3 is used for extracting a threshold voltage Vth and mobility of the second transistor T2 in response to compensation timing to compensate the threshold voltage Vth. The first electrode of the OLED is connected with the second electrode of the second transistor T2, and a second electrode of the OLED is connected with the second power supply line VSS. The OLED is used for emitting light with corresponding brightness in response to the current of the second electrode of the second transistor T2. A first electrode of the storage capacitor $C_{ST}$ is connected with the gate electrode of the second transistor T2, and a second electrode of the storage capacitor $C_{ST}$ is connected with the second electrode of the second transistor T2. The storage capacitor $C_{ST}$ is used for storing a potential of the gate electrode of the second transistor T2. In some possible implementations, it may be set that a voltage of the first power supply line VDD is greater than a voltage of the second power supply line VSS, and the maximum voltage of the data signal transmitted by the data line Dn is smaller than the maximum voltage of the first scanning line and is also smaller than the voltage of the first power supply line VDD.

Figure 2:
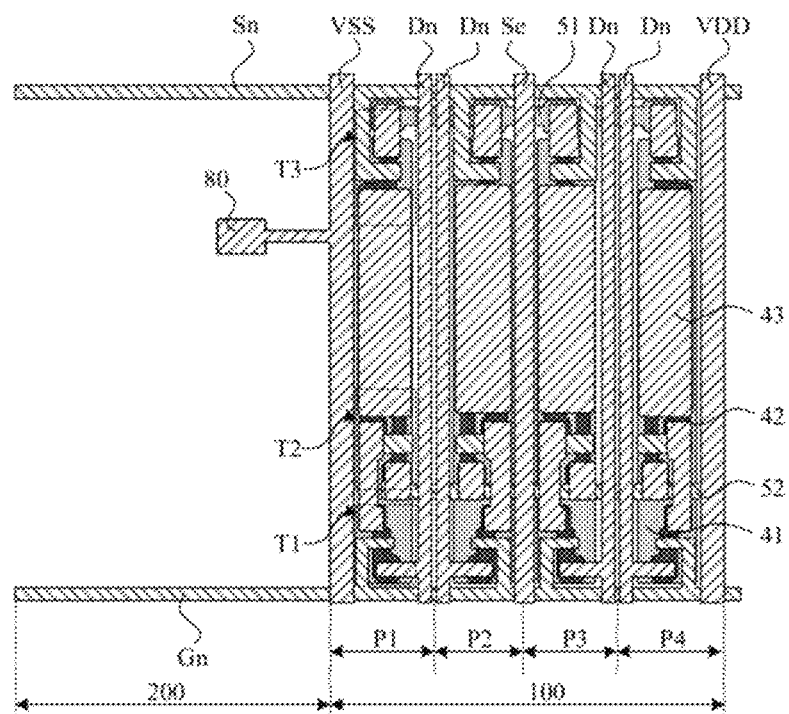
FIG. 2 is a schematic view of a structure of a display substrate according to the present disclosure.

FIG. 2 is a schematic view of a structure of a display substrate according to the present disclosure, illustrating a structure of a display unit. In a direction parallel to the display substrate, the display substrate includes a plurality of display units regularly arranged. Each display unit includes a display area 100 and a transparent area 200. The display area 100 is configured to achieve image display, and the transparent area 200 is configured to allow light to pass through, thereby implementing image display in a transparent state, i.e., transparent display. As shown in FIG. 2, the display substrate includes a plurality of first signal lines and second signal lines, and the first signal lines and the second signal lines vertically intersect to define a plurality of display units. For one display unit, the first signal line includes a first scanning line Gn and a second scanning line Sn which are horizontally arranged, and the second signal line includes a first power supply line VDD, a second power supply line VSS, a compensation line Se and four data lines Dn which are vertically arranged. In an exemplary embodiment, the first scanning line Gn and the second scanning line Sn define one display row which includes one sub-pixel row, the second scanning line Sn is located on the upper side of the defined sub-pixel row, and the first scanning line Gn is located on the lower side of the defined sub-pixel row. Within the sub-pixel row defined by the first scanning line Gn and the second scanning line Sn (i.e., in an area between the first scanning line Gn and the second scanning line Sn), the second power supply line VSS of the display unit and the first power supply line VDD of the display unit define the display area 100 of the display unit, and the second power supply line VSS of the display unit and the first power supply line VDD of an adjacent display unit define the transparent area 200 of the display unit. The transparent area 200 is located on the left side of the display unit, and the display area 100 is located on the right side of the display unit. The display area 100 defined by the first power supply line VDD and the second power supply line VSS includes four sub-pixels provided with a pixel driving circuit, so that the first signal line and the second signal line define four sub-pixels provided with a pixel driving circuit, the four sub-pixels provided with the pixel driving circuit being arranged in parallel. The four sub-pixels arranged in parallel are: a first sub-pixel P1, a second sub-pixel P2, a third sub-pixel P3 and a fourth sub-pixel P4. In the following description, a sub-pixel refers to a sub-pixel provided with a pixel driving circuit.

In an exemplary embodiment, the first sub-pixel P1 is located at a left position in the display area and adjacent to the transparent area 200 of the display unit, the fourth sub-pixel P4 is located at a right position in the display area and adjacent to the transparent area 200 of another display unit, the second sub-pixel P2 and the third sub-pixel P3 are located between the first sub-pixel P1 and the fourth sub-pixel P4, the second sub-pixel P2 is adjacent to the first sub-pixel P1, and the third sub-pixel P3 is adjacent to the fourth sub-pixel P4.

In an exemplary embodiment, in a direction away from the transparent area 200, the second power supply line VSS, two data lines Dn, the compensation line Se, two data lines Dn and the first power supply line VDD are sequentially arranged. The first sub-pixel is formed between the first power supply line VDD and an adjacent data line Dn, the fourth sub-pixel is formed between the second power supply line VSS and an adjacent data line Dn, and the second sub-pixel and the third sub-pixel are respectively formed between the compensation line Se and adjacent data lines Dn. In this way, four sub-pixels are formed between the first power supply line VDD and the second power supply line VSS by arranging one compensation line Se and four data lines Dn therebetween, and among the four data lines Dn, two data lines Dn are located between the compensation line Se and the second power supply line VSS, and the other two data lines Dn are located between the compensation line Se and the first power supply line VDD.

In an exemplary embodiment, the display area 100 further includes a plurality of connection lines, and the plurality of connection lines at least include a compensation connection line 51 and a power supply connection line 52. The compensation connection line 51 is connected with the compensation line Se through a via hole, so that the compensation line Se provides compensation signals to the four sub-pixels through the compensation connection line 51, and the power supply connection line 52 is connected with first power supply line VDD through a via hole, so that the first power supply line VDD provides power signals to the four sub-pixels through the power supply connection line 52, thereby forming a one-to-four structure of the first power supply line VDD and the compensation line Se. In the display substrate according to the present disclosure, the first power supply line and the compensation line are designed in a one-to-four structure, which saves the number of signal lines, reduces the space occupied, has a simple structure and a reasonable layout, makes full use of the layout space, improves the space utilization rate, and is beneficial to improving the resolution and transparency.

As shown in FIG. 2, among the four sub-pixels in the display area, the pixel driving circuit in each sub-pixel includes a first transistor T1, a second transistor T2, a third transistor T3 and a storage capacitor. The first transistor T1 includes a first active layer, a first gate electrode, a first source electrode and a first drain electrode, the second transistor T2 includes a second active layer, a second gate electrode, a second source electrode and a second drain electrode, and the third transistor T3 includes a third active layer, a third gate electrode, a third source electrode and a third drain electrode. The storage capacitor includes a first plate 41, a second plate 42 and a third plate 43. The first plate 41 and the second plate 42 form a first storage capacitor, while the second plate 42 and the third plate 43 form a second storage capacitor. The first plate 41 and the third plate 43 have the same potential. Thus, the first storage capacitor and the second storage capacitor form a parallel structure, which effectively improves the storage capacity. The pixel driving circuit structure of the first sub-pixel P1 and the pixel driving circuit structure of the fourth sub-pixel P4 are mirror symmetric with respect to a vertical axis (the compensation line Se), and the pixel driving circuit structure of the second sub-pixel P2 and the pixel driving circuit structure of the third sub-pixel P3 are mirror symmetric with respect to the vertical axis (the compensation line Se).

In an exemplary embodiment, the first scanning line Gn is connected with the first gate electrode of the first transistor T1 in each sub-pixel, the second scanning line Sn is connected with the third gate electrode of the third transistor T3 in each sub-pixel, the data line Dn is connected with the first source electrode of the first transistor T1 in each sub-pixel, the compensation line Se is connected with the third source electrode of the third transistor T3 in each sub-pixel through the compensation connection line 51, and the first power supply line VDD is connected with the second source electrode of the second transistor T2 in each sub-pixel through the power supply connection line 52. Taking the pixel driving circuit of the first sub-pixel P1 as an example, the first gate electrode of the first transistor T1 is connected with the first scanning line Gn, the first source electrode of the first transistor T1 is connected with the data line Dn, and the first drain electrode of the first transistor T1 is connected with the second gate electrode of the second transistor T2. The second gate electrode of the second transistor T2 is connected with the first drain electrode of the first transistor T1, the second source electrode of the second transistor T2 is connected with the first power supply line VDD through the power supply connection line 52, and the second drain electrode of the second transistor T2 is connected with the third drain electrode of the third transistor T3 and the anode of the light emitting element. The third gate electrode of the third transistor T3 is connected with the second scanning line Sn, the third source electrode of the third transistor T3 is connected with the compensation line Se through the compensation connection line 51, and the third drain electrode of the third transistor T3 is connected with the second drain electrode of the second transistor T2 and the anode of the light emitting element. The first plate 41 is connected with the second drain electrode of the second transistor T2 and the third drain electrode of the third transistor T3 respectively, the second plate 42 is connected with the first drain electrode of the first transistor T1 and the second gate electrode of the second transistor T2 respectively, and the third plate 43 is connected with the second drain electrode of the second transistor T2 and the third drain electrode of the third transistor T3 respectively. Therefore, the first plate 41 and the third plate 43 have the same potential, the second plate 42 has a different potential from the first plate 41 and the third plate 43, the first plate 41 and the second plate 42 form a first storage capacitor, the third plate 43 and the second plate 42 form a second storage capacitor, and the first storage capacitor and the second storage capacitor are in a parallel structure.

In an exemplary embodiment, in a direction perpendicular to the display substrate, each sub-pixel includes a first metal layer, a first insulating layer, a semiconductor layer, a second insulating layer, a second metal layer, a third insulating layer, a third metal layer, a fourth insulating layer and a flat layer which are stacked on the substrate.

The first metal layer at least includes the first plate 41 and the compensation connection line 51, the first plate 41 also serves as a shielding layer of the display substrate, and the first plate 41 and the compensation connection line 51 are arranged on the same layer and formed by the same patterning process. The semiconductor layer at least includes the second plate 42 and the active layers of the three transistors, and the second plate 42 and the active layers of the three transistors are arranged on the same layer and formed by the same patterning process. The second metal layer at least includes the first scanning line Gn, the second scanning line Sn, the power supply connection line 52, the auxiliary power supply line and the gate electrodes of the three transistors, and the first scanning line Gn, the second scanning line Sn, the power supply connection line 52, the auxiliary power supply line and the gate electrodes of the three transistors are arranged on the same layer and formed by the same patterning process. The third metal layer at least includes the data lines Dn, the first power supply line VDD, the second power supply line VSS, the third plate 43 and the source and drain electrodes of the three transistors, and the data lines Dn, the first power supply line VDD, the second power supply line VSS, the third plate 43, and the source and drain electrodes of the three transistors are arranged on the same layer and formed by the same patterning process. There is at least an overlapping area between the orthographic projection of the first plate 41 on the substrate and the orthographic projection of the second plate 42 on the substrate to form a first storage capacitor, and there is at least an overlapping area between the orthographic projection of the third plate 43 on the substrate and the orthographic projection of the second plate 42 on the substrate to form a second storage capacitor. The first plate 41 is connected with the third plate 43 through a via hole, so that the first plate 41 and the third plate 43 have the same potential, thereby forming a parallel structure of the first storage capacitor and the second storage capacitor.

As shown in FIG. 2, the transparent area 200 is defined by the first scanning line Gn, the second scanning line Sn, the first power supply line VDD and the second power supply line VSS. The transparent area 200 includes an auxiliary cathode 80. The auxiliary cathode 80 is connected with the second power supply line VSS, and the auxiliary cathode 80 and the second power supply line VSS are arranged on the same layer and formed by the same patterning process. On the one hand, the auxiliary cathode 80 is configured to reduce the diffraction effect of the transparent area, and on the other hand, the auxiliary cathode 80 is configured to provide a low-level signal to the cathode of the light emitting element in the display area 100.

Diffraction effect means that light is bent and scattered at different degrees when passing through obstacles such as a slit, and therefore deviates from the original straight line. In the diffraction effect, the width of the slit affects the distribution of diffraction fringes, and in the parts with the same slit width, positions where diffraction fringes are generated are consistent, thereby leading to obvious diffraction effect. In a transparent display substrate, the transparent area has a regular rectangular shape, so the diffraction effect is obvious, which leads to blurring of objects behind the screen and seriously affects the effect of transparent display. In the present disclosure, the auxiliary cathode 80 is arranged in the transparent area 200 to change the transparent area into an irregular shape, and when light passes through the irregular transparent area, as diffraction fringes are generated at different positions and in different directions, the diffraction fringes generated by light will not spread in one direction but in multiple directions, thus greatly weakening the diffraction effect, avoiding blurring of objects behind the screen and improving the effect of transparent display. In a large-size transparent display substrate, as the layout space of the display area is small, a structure in which the second power supply line VSS directly supplies a low-level signal to the cathode of the light emitting element is generally adopted. In the present disclosure, the auxiliary cathode 80 is arranged in the transparent area 200, and the auxiliary cathode 80 is connected with the cathode of the light emitting element, which can effectively alleviate the IR Drop of the large-size transparent display, ensuring uniformity of display. The auxiliary cathode 80 is arranged in the transparent area 200, which is beneficial to simplifying the structural layout of the display area, reducing the space occupied by each sub-pixel, improving the area ratio of the transparent area, and improving the resolution and transparency.

The structure of the display substrate is described below through an example of a preparation process of the display substrate. The "patterning process" mentioned in the present disclosure includes the treatments, such as film layer deposition, photoresist coating, mask exposure, development, etching, and photoresist stripping. Deposition may be implemented by any one or more of sputtering, evaporation and chemical vapor deposition, coating may be implemented by any one or more of spraying and spin coating, and etching may be implemented by any one or more of dry etching and wet etching. "Thin film" refers to a layer of thin film fabricated by using a deposition or coating process to deal with a certain material on a substrate. If the "thin film" does not require a patterning process during the whole fabrication process, the "thin film" can also be called a "layer". If the "thin film" requires a patterning process throughout the whole fabrication process, it is referred to as a "thin film" before the patterning process and as a "layer" after the patterning process. The "layer" after the patterning process contains at least one "pattern". In the present disclosure, "A and B being arranged on a same layer" means that A and B are formed at the same time by the same patterning process.

FIGS. 3-17 are schematic diagrams of the preparation process of a display substrate according to the present disclosure, illustrating a layout structure of a display unit of a top emission OLED display substrate, in which each display unit includes a display area 100 and a transparent area 200, the display area 100 includes a first sub-pixel P1, a second sub-pixel P2, a third sub-pixel P3 and a fourth sub-pixel P4, the pixel driving circuit of each sub-pixel includes a first transistor T1, a second transistor T2, a third transistor T3 and a storage capacitor.

Figure 3:
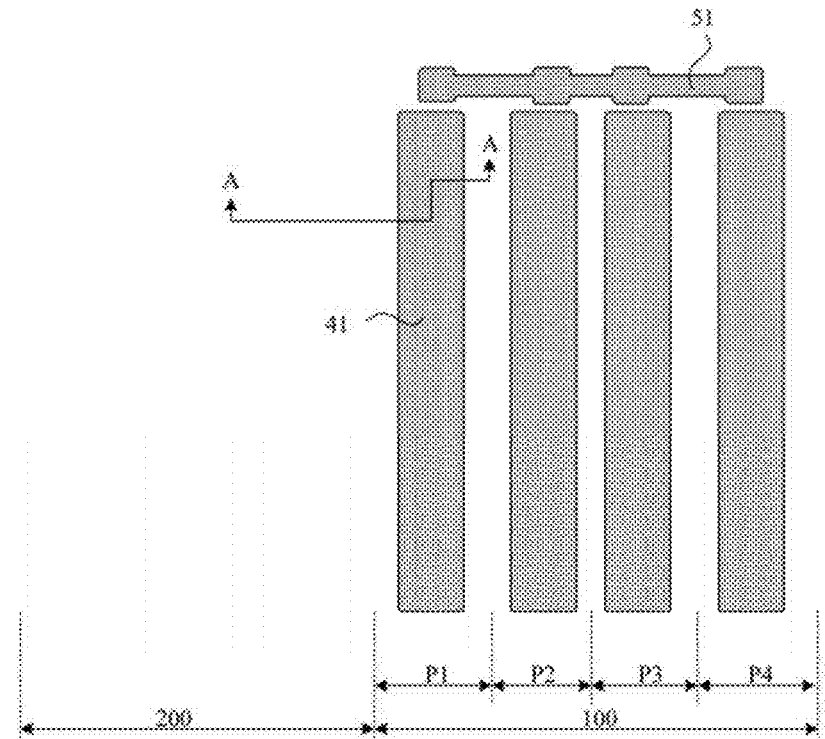
FIG. 3 is a schematic view after a pattern of a first metal layer is formed according to the present disclosure.
Figure 4:
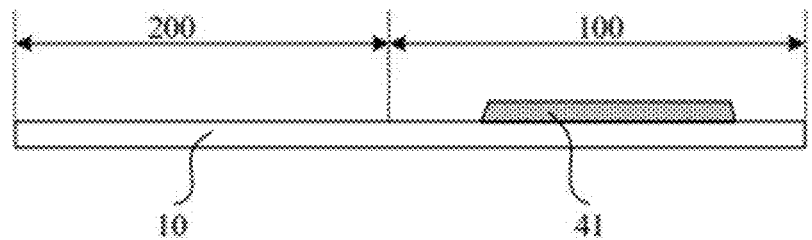
FIG. 4 is a sectional view of FIG. 3 in an A-A direction.

(1) Forming a pattern of a first metal layer, which includes: depositing a first metal thin film on a substrate, patterning the first metal thin film by a patterning process to form a pattern of a first metal layer on the substrate 10. The pattern of the first metal layer includes a first plate 41 and a compensation connection line 51. Each sub-pixel is formed with one first plate 41, and the compensation connection line 51 has a strip structure spanning four sub-pixels, as shown in FIGS. 3 and 4, wherein FIG. 4 is a sectional view of FIG. 3 in an A-A direction. In an exemplary embodiment, the first plate 41 serves as a plate of a first storage capacitor and is configured to form the first storage capacitor with a second plate formed subsequently, and the first plate 41 also serves as a shielding layer and is configured to shield the transistors to reduce the intensity of light irradiated onto the transistors and reduce the leakage current, thereby reducing the influence of light irradiation on the properties of the transistors. The compensation connection line 51 is configured to be connected with a compensation line formed subsequently, so that the compensation line provides a compensation signal to each sub-pixel. In an exemplary embodiment, the first plate 41 has an elongated rectangular shape, and the first plate 41 completely covers the area of the pixel driving circuit in each sub-pixel except the position of the compensation connection line 51. In order to achieve effective shielding, in the direction of the elongated strip, the length of the first plate 41 is greater than the distance between the gate electrode of the first transistor and the gate electrode of the third transistor which are formed subsequently. In some possible implementations, the length of the first plate 41 is greater than the distance between the first electrode of the first transistor and the first electrode of the third transistor which are formed subsequently. In an exemplary embodiment, the pattern of the first metal layer in the first sub-pixel P1 and the pattern of the first metal layer in the fourth sub-pixel P4 are mirror symmetric with respect to a vertical axis, and the pattern of the first metal layer in the second sub-pixel P2 and the pattern of the first metal layer in the third sub-pixel P3 are mirror symmetric with respect to the vertical axis.

After this patterning process, the pattern of the first metal layer is formed in the display area 100, and there is no corresponding film layer in the transparent area 200.

Figure 5:
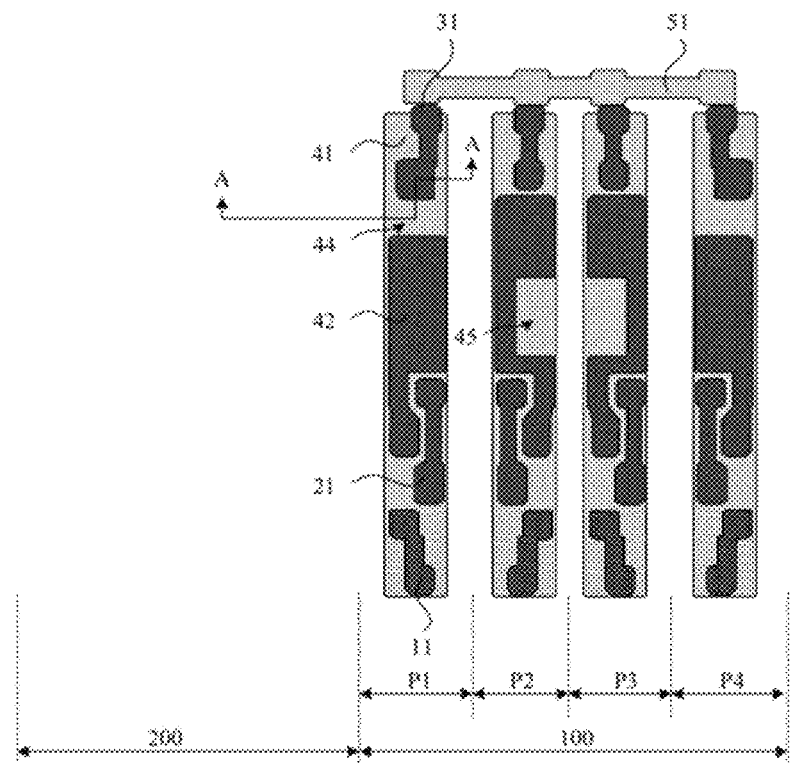
FIG. 5 is a schematic view after a pattern of a semiconductor layer is formed according to the present disclosure.
Figure 6:
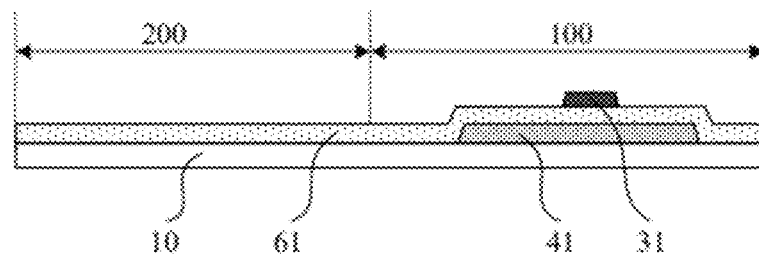
FIG. 6 is a sectional view of FIG. 5 in an A-A direction.

(2) Forming a pattern of a semiconductor layer, which includes: depositing a first insulating thin film and a semiconductor thin film sequentially on the substrate on which the above pattern is formed, patterning the semiconductor thin film by a patterning process to form a first insulating layer 61 covering the pattern of the first metal layer and a pattern of a semiconductor layer formed on the first insulating layer 61. The semiconductor layer includes patterns of a first active layer 11, a second active layer 21, a third active layer 31 and a second plate 42 which are arranged in each sub-pixel, as shown in FIGS. 5 and 6, wherein FIG. 6 is a sectional view of FIG. 5 in an A-A direction. The first active layer 11 serves as the active layer of the first transistor, the second active layer 21 serves as the active layer of the second transistor, and the third active layer 31 serves as the active layer of the third transistor. There is an overlapping area between the orthographic projection of the second plate 42 on the substrate 10 and the orthographic projection of the first plate 41 on the substrate 10, and the first plate 41 and the second plate 42 form a first storage capacitor. The second plate 42 not only serves as a pole plate of the first storage capacitor, but also as a pole plate of the second storage capacitor. The second plate is configured to form the second storage capacitor with a third plate formed later.

In an exemplary embodiment, there is an overlapping area between the orthographic projections of the first active layer 11, the second active layer 21 and the third active layer 31 on the substrate 10 and the orthographic projection of the first plate 41 on the substrate 10, so that the first plate 41 serving as a shielding layer can shield channel regions of the first transistor, the second transistor and the third transistor to prevent light from affecting the channels so as to prevent the channels from generating light-generated leakage to affect the display effect. The orthographic projections of the first active layer 11, the second active layer 21 and the third active layer 31 on the substrate 10 are spaced apart from the orthographic projection of the second plate 42 on the substrate 10, that is, there is no overlapping area between the first active layer 11 and the second plate 42, between the second active layer 21 and the second plate 42 and between the third active layer 31 and the second plate 42, which is beneficial to designing the width-length ratio of the channels of the first transistor, the second transistor and the third transistor according to relevant requirements. In an exemplary embodiment, there is a spacing 44 between the third active layer 31 and the second plates 42 in the first sub-pixel P1 and the fourth sub-pixel P4 respectively, and an opening 45 is provided respectively in the middle of the second plates 42 of the second sub-pixel P2 and the third sub-pixel P3. In an exemplary embodiment, the pattern of the semiconductor layer in the first sub-pixel P1 and the pattern of the semiconductor layer in the fourth sub-pixel P4 are mirror symmetric with respect to a vertical axis, and the pattern of the semiconductor layer in the second sub-pixel P2 and the pattern of the semiconductor layer in the third sub-pixel P3 are mirror symmetric with respect to the vertical axis. In an exemplary embodiment, the semiconductor layer may be made of a metal oxide.

After this patterning process, the pattern of the semiconductor layer is formed in the display area 100, and the transparent area 200 includes the substrate 10 and the first insulating layer 61 arranged on the substrate 10.

Figure 7:
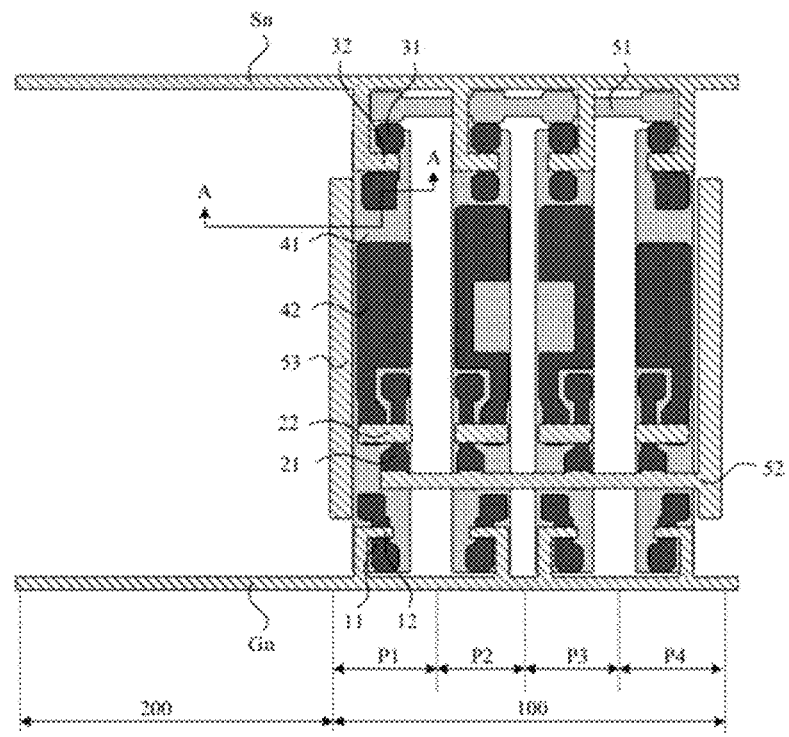
FIG. 7 is a schematic view after a pattern of a second metal layer is formed according to the present disclosure.
Figure 8:
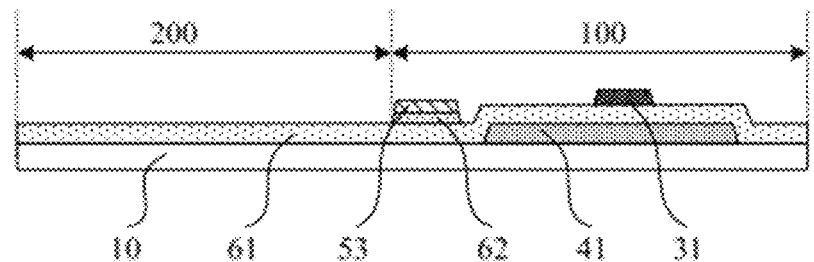
FIG. 8 is a sectional view of FIG. 7 in an A-A direction.

(3) Forming a pattern of a second metal layer, which includes: depositing a second insulating thin film and a second metal thin film sequentially on the substrate on which the above patterns are formed, patterning the second insulating thin film and the second metal thin film by a patterning process to form a pattern of a second insulating layer 62 and a pattern of a second metal layer arranged on the second insulating layer 62. The pattern of the second metal layer includes a first scanning line Gn, a second scanning line Sn, a power supply connection line 52 and an auxiliary power supply line 53 formed in each display unit, and a first gate electrode 12, a second gate electrode 22 and a third gate electrode 32 formed in each sub-pixel, as shown in FIGS. 7 and 8, wherein FIG. 8 is a sectional view of FIG. 7 in an A-A direction. The first scanning line Gn and the second scanning line Sn are arranged in parallel and extend straightly in the horizontal direction. The first scanning line Gn is located on the upper side of the sub-pixel and the second scanning line Sn is located on the lower side of the sub-pixel. The first gate electrode 12 is connected and formed an integrated structure with the first scanning line Gn and spans the first active layer 11, the second gate electrode 22 spans the second active layer 21 and has an overlapping area with the second plate 42, and the third gate electrode 32 is connected and formed an integrated structure with the second scanning line Sn and spans the third active layer 31. The power supply connection line 52 includes a first connection strip perpendicular to the first scanning line Gn and a second connection strip parallel to the first scanning line Gn. One end of the first connection strip and one end of the second connection strip are connected with each other. The first connection strip is formed in an area where the first power supply line VDD is located in the display unit, and is configured to be connected with the first power supply line VDD formed subsequently, and the second connection strip spans the four sub-pixels and is configured to provide a high-level signal to each sub-pixel. The auxiliary power supply line 53 is formed in an area where the second power supply line VSS is located in the display unit, perpendicular to the first scanning line Gn, and configured to be connected with the second power supply line VSS formed subsequently. In an exemplary embodiment, the first connection strip of the power supply connection line 52 and the auxiliary power supply line 53 are located between the first gate electrode 12 and the third gate electrode 32. In an exemplary embodiment, the pattern of the second insulating layer 62 is the same as the pattern of the second metal layer, that is, the second insulating layer 62 is located below the second metal layer, and there is no second insulating layer 62 in the area outside the second metal layer. In an exemplary embodiment, the first gate electrodes 12, the second gate electrodes 22 and the third gate electrodes 32 in the first sub-pixel P1 and the fourth sub-pixel P4 are respectively mirror symmetric with respect to the vertical axis, and the first gate electrodes 12, the second gate electrodes 22 and the third gate electrodes 32 in the second sub-pixel P2 and the third sub-pixel P3 are respectively mirror symmetric with respect to the vertical axis.

In an exemplary embodiment, this process further includes a conduction treatment. Conduction treatment is to perform plasma treatment by using the first gate electrode 12, the second gate electrode 22 and the third gate electrode 32 as a shield after the formation of the pattern of the second metal layer. The semiconductor layer in an area shielded by the first gate electrode 12, the second gate electrode 22 and the third gate electrode 32 (i.e., an area of the semiconductor layer overlapping with the first gate electrode 12, the second gate electrode 22 and the third gate electrode) serves as channel regions of the transistors, and the semiconductor layer in an area not shielded by the second metal layer is treated into a conductive layer to form a conductive second plate 42 and conductive source and drain regions.

After this patterning process, the pattern of the second metal layer is formed in the display area 100, and the transparent area 200 includes the substrate 10 and the first insulating layer 61 arranged on the substrate 10.

Figure 9:
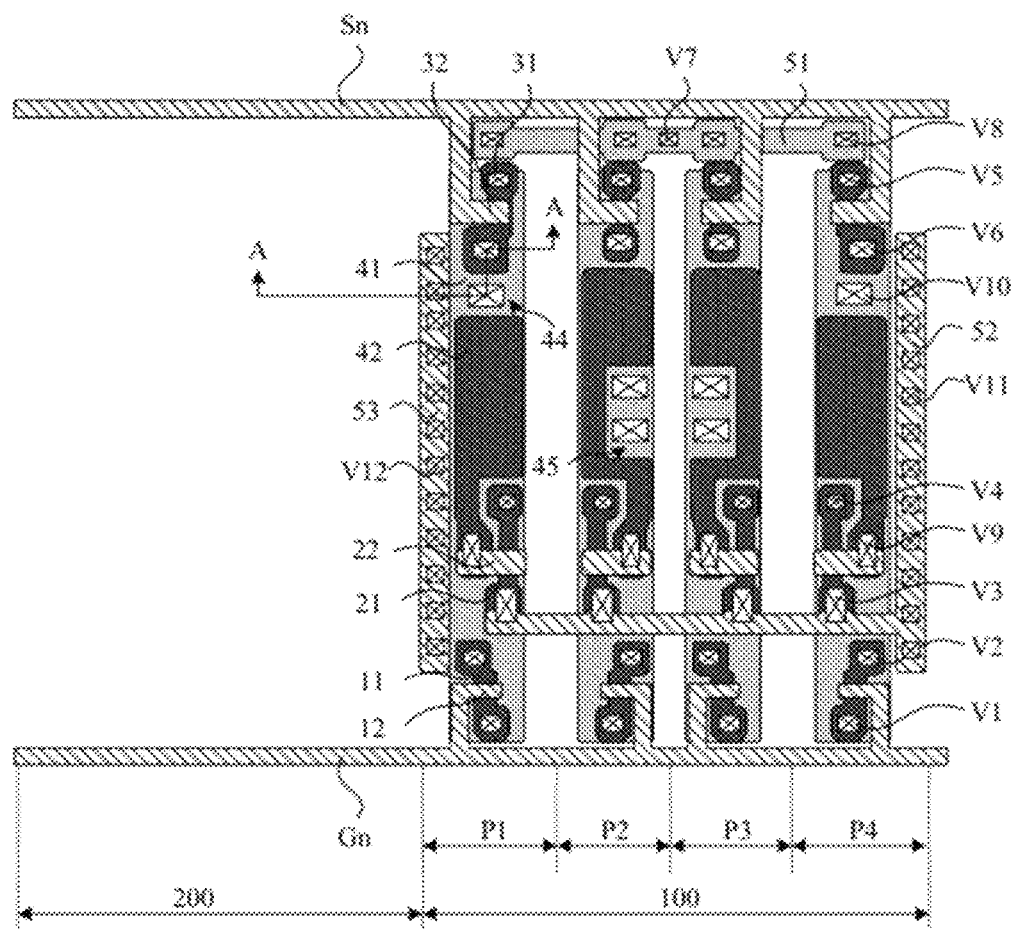
FIG. 9 is a schematic view after a pattern of a third insulating layer is formed according to the present disclosure.
Figure 10:
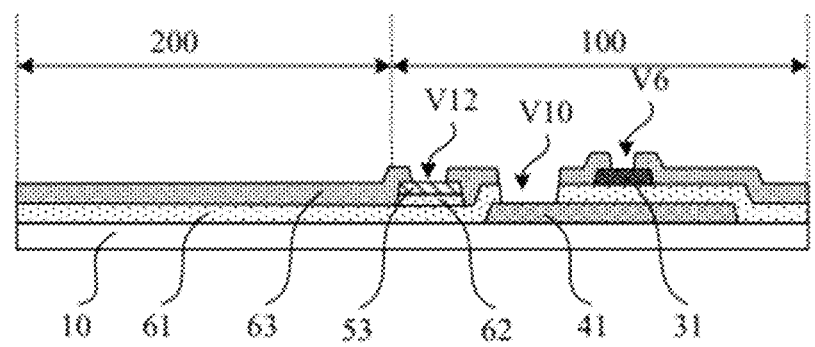
FIG. 10 is a sectional view of FIG. 9 in an A-A direction.

(4) Forming a pattern of a third insulating layer, which includes: depositing a third insulating thin film on the substrate on which the above patterns are formed, patterning the third insulating thin film by a patterning process to form a pattern of a third insulating layer 63 covering the above structure. The third insulating layer 63 is provided with patterns of a plurality of via holes, including: a first via hole V1 and a second via hole V2 located on the two sides of the first gate electrode 12, a third via hole V3 and a fourth via hole V4 located on the two sides of the second gate electrode 22, a fifth via hole V5 and a sixth via hole V6 located on the two sides of the third gate electrode 32, a seventh via hole V7 and an eighth via hole V8 located at the position of the compensation connection line 51, a ninth via hole V9 located in the overlapping area between the second gate electrode 22 and the second plate 42, a tenth via hole V10 located at the position of the first plate 41, a plurality of eleventh via holes V11 located at the position of the first connection strip of the power supply connection line 52, and a plurality of twelfth via holes V12 located at the position of the auxiliary power supply line 53, as shown in FIGS. 9 and 10, wherein FIG. 10 is a sectional view of FIG. 9 in an A-A direction.

The third insulating layer 63 in the first via hole V1 and the second via hole V2 is etched away, exposing the surfaces at both ends of the first active layer 11. The third via hole V3 is a transfer via hole consisting of two half holes, with one half hole being formed on the second active layer 21 and the other half hole being formed on the second connection strip of the power supply connection line 52. The third insulating layer 63 in the two half holes is etched away, so that the transfer via hole formed by the two half holes exposes the surface of the second active layer 21 and the surface of the second connection strip of the power supply connection line 52 simultaneously, and the third insulating layer 63 in the fourth via hole V4 is etched away, exposing the surface of the second active layer 21. The third insulating layer 63 in the fifth via hole V5 and the sixth via hole V6 is etched away, exposing the surfaces at both ends of the third active layer 31. The seventh via hole V7 is located at a position where the compensation connection line 51 overlaps with the compensation line formed subsequently. Each sub-pixel is formed with an eighth via hole V8. The first insulating layer 61 and the third insulating layer 63 in the seventh via hole V7 and the eighth via hole V8 are etched away, exposing the surface of the compensation connection line 51. The ninth via hole V9 is a transfer via hole consisting of two half holes, with one half hole being formed on the second gate electrode 22 and the other half hole being formed on the second plate 42. The third insulating layer 63 in the two half holes is etched away, so that the transfer via hole formed by the two half holes exposes the surface of the second gate electrode 22 and the surface of the second plate 42 simultaneously. The tenth via holes V10 in the first sub-pixel P1 and the fourth sub-pixel P4 are located at the position of the spacing 44 between the second plate 42 and the third active layer 31, the tenth via holes V10 in the second sub-pixel P2 and the third sub-pixel P3 are located at the position of the opening 45 in the middle of the second plate 42, and the first insulating layer 61 and the third insulating layer 63 in the tenth via holes V10 are etched away, exposing the surface of the first plate 41. The eleventh via hole V11 is located at the position of the first connection strip of the power supply connection line 52, a plurality of eleventh via holes V11 are arranged at intervals, and the third insulating layer 63 in the eleventh via holes V11 is etched away, exposing the surface of the first connection strip of the power supply connection line 52. The twelfth via hole V12 is located at the position of the auxiliary power supply line 53, a plurality of twelfth via holes V12 are arranged at intervals, and the third insulating layer 63 in the twelfth via holes V12 is etched away, exposing the surface of the auxiliary power supply line 53.

After this patterning process, the patterns of the plurality of via holes are formed in the display area 100, and the transparent area 200 includes the first insulating layer 61 and the third insulating layer 63 stacked on the substrate 10.

Figure 11:
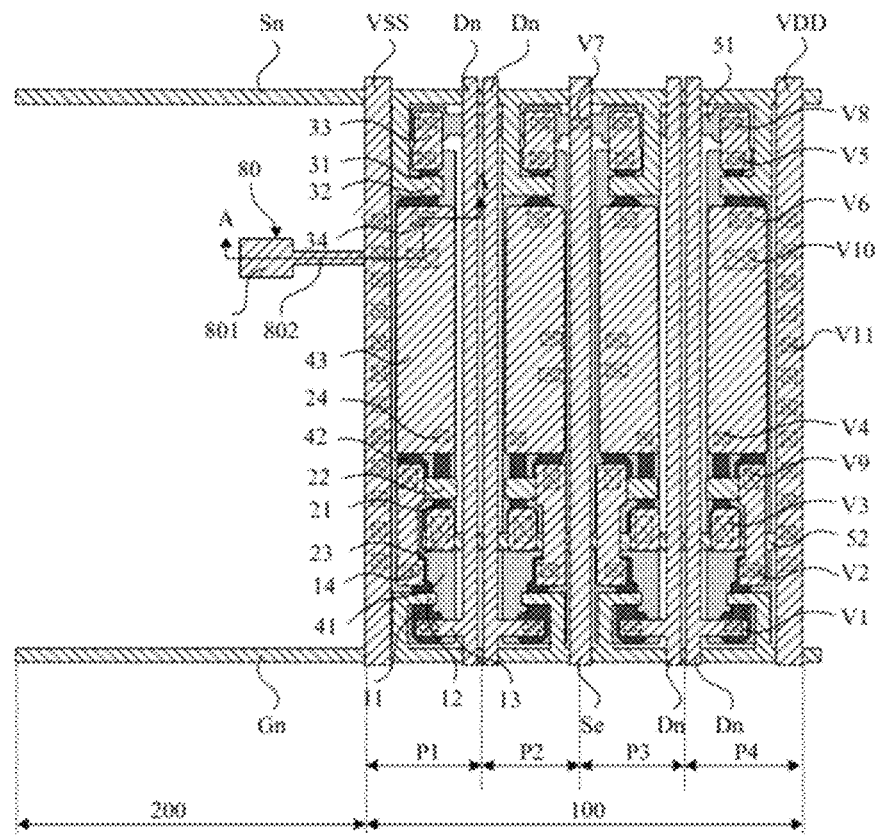
FIG. 11 is a schematic view after a pattern of a third metal layer is formed according to the present disclosure.
Figure 12:
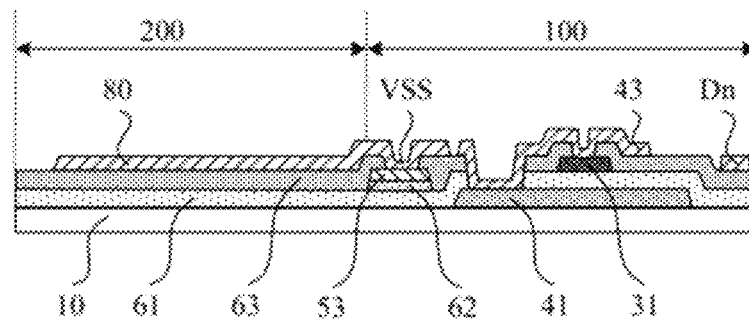
FIG. 12 is a sectional view of FIG. 11 in an A-A direction.

(5) Forming a pattern of a third metal layer, which includes: depositing a third metal thin film on the substrate on which the above patterns are formed, and patterning the third metal thin film by a patterning process to form a pattern of a third metal layer and a pattern of an auxiliary cathode 80 on the third insulating layer 63. The third metal layer is formed in the display area 100, and the auxiliary cathode 80 is formed in the transparent area 200. The third metal layer in the display area 100 includes: one first power supply line VDD, one second power supply line VSS, one compensation line Se and four data lines Dn formed in each display unit, and patterns of a first source electrode 13, a first drain electrode 14, a second source electrode 23, a second drain electrode 24, a third source electrode 33, a third drain electrode 34 and a third plate 43 formed in each sub-pixel. The auxiliary cathode 80 in the transparent area 200 and the second power supply line VSS are in an integrated structure in which they are connected with each other, as shown in FIGS. 11 and 12, wherein FIG. 12 is a sectional view of FIG. 11 in an A-A direction.

In an exemplary embodiment, the first power supply line VDD, the second power supply line VSS, the compensation line Se and the data lines Dn are arranged in parallel and extend along the vertical direction. The second power supply line VSS is arranged on a side close to the transparent area 200, the first power supply line VDD is arranged on a side away from the transparent area 200, the compensation line Se is arranged between the first power supply line VDD and the second power supply line VSS, two data lines Dn are arranged between the second power supply line VSS and the compensation line Se, and the other two data lines Dn are arranged between the first power supply line VDD and the compensation line Se.

In an exemplary embodiment, the first power supply line VDD is connected with the power supply connection line 52 through a plurality of eleventh via holes V11, so that the first power supply line VDD is connected with the second source electrode 23 of each sub-pixel through the power supply connection line 52, to form a double-layer routing between the first gate electrode 12 and the third gate electrode 32, which ensures the reliability of transmission of power signals and reduces the resistance of the first power supply line VDD. The double-layer routing includes the power supply connection line 52 of the second metal layer and the first power supply line VDD of the third metal layer. The second power supply line VSS is connected with the auxiliary power supply line 53 through a plurality of twelfth via holes V12, to form a double-layer routing between the first gate electrode 12 and the third gate electrode 32, which ensures the reliability of transmission of power signals and reduces the resistance of the second power supply line VSS. The double-layer routing includes the auxiliary power supply line 53 of the second metal layer and the second power supply line VSS of the third metal layer. In some possible implementations, in the direction parallel to the first scanning line Gn and the second scanning line Sn, the widths of the first power supply line VDD and the second power supply line VSS are both greater than the width of the compensation line Se, and the widths of the first power supply line VDD and the second power supply line VSS are both greater than the width of the data line Dn, which can further reduce the resistances of the first power supply line VDD and the second power supply line VSS. The compensation line Se is connected with the compensation connection line 51 through the seventh via hole V7, so that the compensation line Se is respectively connected with the third source electrode 33 of each sub-pixel through the compensation connection line 51. The compensation line Se is arranged in the middle of the display area 100, and is connected with the third transistors of the sub-pixels on both sides of the display area through the compensation connection line 51, and the third transistors of the sub-pixels on the left and right sides are symmetrically arranged with respect to the compensation line Se. This symmetrical design enables each display unit to need only one compensation line Se, which can ensure that the compensation signals substantially have the same RC delay before being written into the transistors, thus ensuring uniformity of display.

In an exemplary embodiment, the first source electrode 13 is connected and formed an integrated structure with the data lines Dn, so that each data line Dn is connected with the first source electrode 13 of the sub-pixel in which the data line Dn is located, the first source electrode 13 is connected with one end of the first active layer 11 through the first via hole V1, the first drain electrode 14 is connected with the other end of the first active layer 11 through the second via hole V2, and the first drain electrode 14 is simultaneously connected with the second gate electrode 22 and the second plate 42 through the ninth via hole V9 having a transfer structure, thus enabling the first drain electrode 14, the second gate electrode 22 and the second plate 42 to have the same potential. The second source electrode 23 is simultaneously connected with the power supply connection line 52 and one end of the second active layer 21 through the third via hole V3 having a transfer structure, thus implementing the connection between the second source electrode 23 and the first power supply line VDD, and the second drain electrode 24 is connected with the other end of the second active layer 21 through the fourth via hole V4. The third source electrode 33 is connected with one end of the third active layer 31 through the fifth via hole V5 and also connected with the compensation connection line 51 through the eighth via hole V8, thus implementing the connection between the third source electrode 33 and the compensation line Se, and the third drain electrode 34 is connected with the other end of the third active layer 31 through the sixth via hole V6. The second drain electrode 24, the third drain electrode 34 and the third plate 43 are in an integrated structure in which they are connected with each other, and the third plate 43 is connected with the first plate 41 through the tenth via hole V10. Therefore, the second drain electrode 24 is simultaneously connected with the first plate 41 and the third plate 43, and the third drain electrode 34 is simultaneously connected with the first plate 41 and the third plate 43, thus enabling the second drain electrode 24, the third drain electrode 34, the first plate 41 and the third plate 43 to have the same potential. There is an overlapping area between the orthographic projection of the third plate 43 on the substrate 10 and the orthographic projection of the second plate 42 on the substrate 10, and the third plate 43 and the second plate 42 form the second storage capacitor. In an exemplary embodiment, the first source electrodes 13, the first drain electrodes 14, the second source electrodes 23, the second drain electrodes 24, the third source electrodes 33, the third drain electrodes 34 and the third plates 43 in the first sub-pixel P1 and the fourth sub-pixel P4 are respectively mirror symmetric with respect to the vertical axis; and the first source electrodes 13, the first drain electrodes 14, the second source electrodes 23, the second drain electrodes 24, the third source electrodes 33, the third drain electrodes 34 and the third plates 43 in the second sub-pixel P2 and the third sub-pixel P3 are mirror symmetric with respect to the vertical axis.

In an exemplary embodiment, the auxiliary cathode 80 is configured to reduce the diffraction effect of the transparent area. By arranging the auxiliary cathode 80 in the transparent area 200 to change the transparent area 200 from a regular rectangle to an irregular shape, the transparent area 200 has different slit widths at different positions. When light passes through the irregular transparent area 200, as diffraction fringes are generated at different positions and in different directions, the diffraction fringes generated by light will not spread in one direction but in multiple directions, thus greatly weakening the diffraction effect, avoiding blurring of objects behind the screen and improving the effect of transparent display. In some possible implementations, the auxiliary cathode 80 of the transparent area 200 includes an electrode block 801 and a connection strip 802. The electrode block 801 is connected with the second power supply line VSS through the connection strip 802. The electrode block 801 may include any one or more of a circle, an ellipse, a rectangle, a trapezoid, a pentagon, a hexagon and a dumbbell shape, and the connection strip 802 may be any one or more of a straight strip, a zigzag strip and an arcuate strip, which is not specifically limited here in the present disclosure. In some possible implementations, the width of the electrode block 801 is greater than the width of the connection strip 802 in the direction parallel to the second power supply line VSS, and the length of the connection strip 802 is greater than the length of the electrode block 801 in the direction perpendicular to the second power supply line VSS.

In some possible implementations, the auxiliary cathode 80 may be set at a position adjacent to the first scanning line Gn, or adjacent to the second scanning line Sn, or between the first scanning line Gn and the second scanning line Gn. The transparent area 200 may be provided with one auxiliary cathode 80, or two or more auxiliary cathodes 80. The area of the electrode block 801 may be 5% to 20% of the area of the transparent area 200, which is not specifically limited here in the present disclosure.

After this patterning process, the pattern of the third metal layer is formed in the display area 100, and the transparent area 200 includes the first insulating layer 61 and the third insulating layer 63 stacked on the substrate 10, and the auxiliary cathode 80 arranged on the third insulating layer 63.

Figure 13:
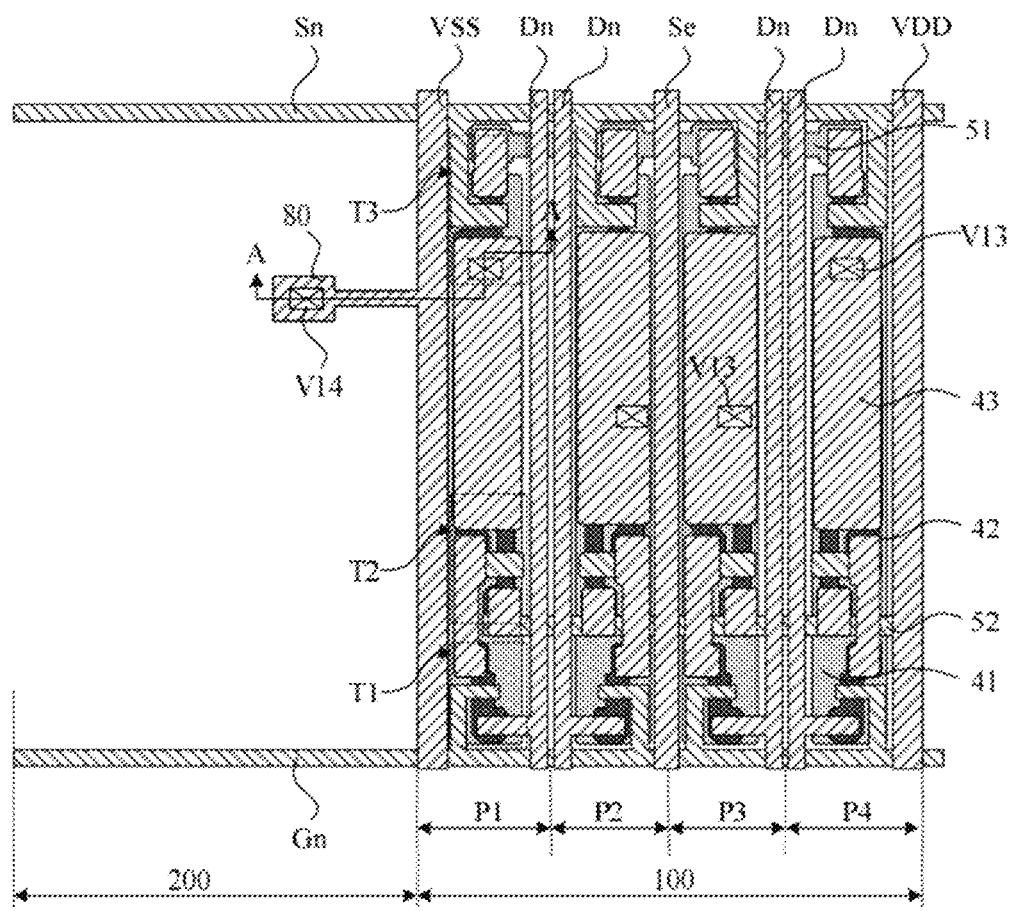
FIG. 13 is a schematic view after patterns of a fourth insulating layer and a pattern of a flat layer are formed according to the present disclosure.
Figure 14:
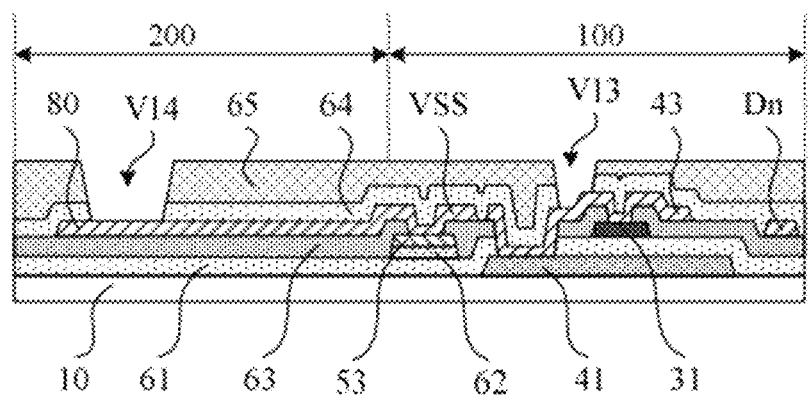
FIG. 14 is a sectional view of FIG. 13 in an A-A direction.

(6) Forming patterns of a fourth insulating layer and a flat layer, which includes: first depositing a fourth insulating thin film on the substrate on which the above patterns are formed, then coating a flat thin film, and etching the fourth insulating thin film through masking, exposure and development of the flat thin film to form a pattern of a fourth insulating layer 64 covering the above structure and a pattern of a flat layer (or referred to as Planarizationlayer, PLN) 65 arranged on the fourth insulating layer 64. The fourth insulating layer 64 and the flat layer 65 are provided with patterns of a plurality of via holes which at least include: a thirteenth via hole V13 located at the position of the third plate 43 in each sub-pixel of the display area 100 and a fourteenth via hole V14 located at the position of the auxiliary cathode 80 in the transparent area 200, as shown in FIGS. 13 and 14, wherein FIG. 14 is a sectional view of FIG. 13 in an A-A direction. In an exemplary embodiment, in the first sub-pixel P1 and the fourth sub-pixel P4, the thirteenth via holes V13 are located at the position of the spacings 44 between the second plates 42 and the third active layers 31; and in the second sub-pixel P2 and the third sub-pixel P3, the thirteenth via holes V13 are located at the position of the openings 45 of the second plates 42. The fourth insulating layer 64 and the flat layer 65 in the thirteenth via holes V13 are etched away, exposing the surface of the third plate 43; and the fourth insulating layer 64 and the flat layer 65 in the fourteenth via holes V14 are etched away, exposing the surface of the auxiliary cathode 80.

After this patterning process, the transparent area 200 includes the first insulating layer 61 and the third insulating layer 63 stacked on the substrate 10, the auxiliary cathode 80 arranged on the third insulating layer 63, the fourth insulating layer 64 and the flat layer 65 covering the auxiliary cathode 80. The fourth insulating layer 64 and the flat layer 65 are provided with the fourteenth via hole V14 exposing the auxiliary cathode 80.

Figure 15:
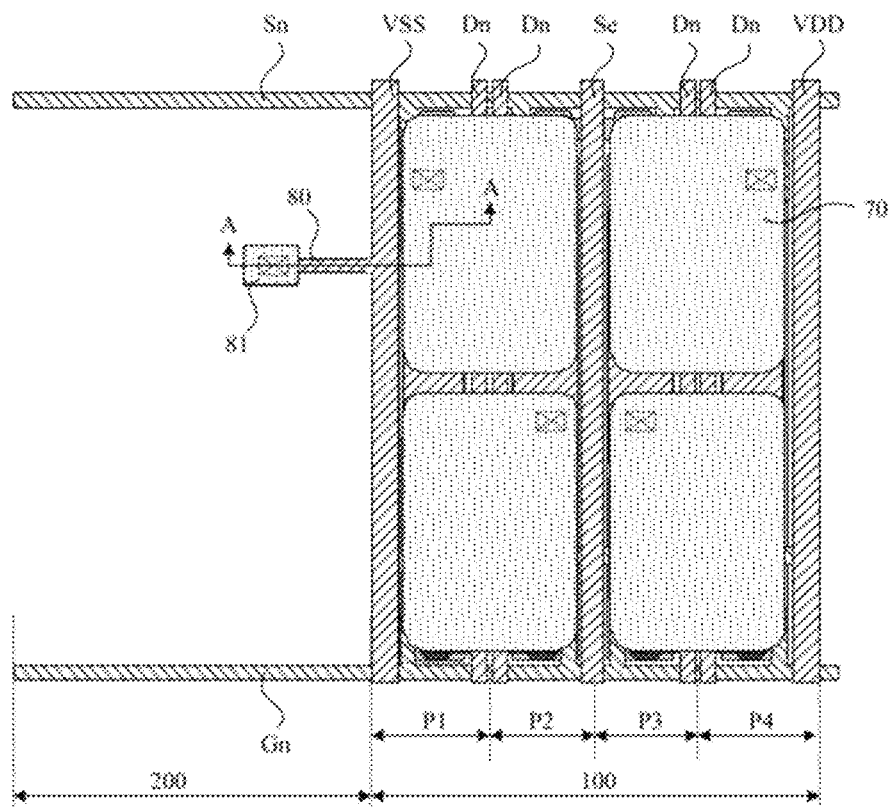
FIG. 15 is a schematic view after a pattern of a transparent conductive layer is formed according to the present disclosure.
Figure 16:
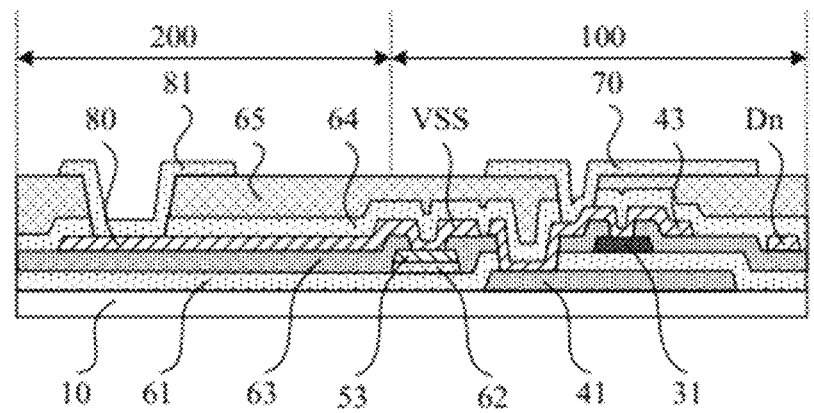
FIG. 16 is a sectional view of FIG. 15 in an A-A direction.

(7) Forming a pattern of a transparent conductive layer, which includes: depositing a transparent conductive thin film on the substrate on which the above patterns are formed, and patterning the transparent conductive thin film by a patterning process to form a pattern of a transparent conductive layer on the flat layer 65. The transparent conductive layer includes an anode 70 and a connection electrode 81. The anode 70 is formed in each sub-pixel of the display area 100. The anode 70 in each sub-pixel is connected with the drain electrode of the second transistor T2 through the thirteenth via hole V13 in the corresponding sub-pixel, the connection electrode 81 is formed at the position where the auxiliary cathode 80 is located in the transparent area 100, and the connection electrode 81 is connected with the auxiliary cathode 80 through the fourteenth via hole V14, as shown in FIGS. 15 and 16, wherein FIG. 16 is a sectional view of FIG. 15 in an A-A direction. Since the drain electrode of the second transistor T2, the drain electrode of the third transistor T3 and the third plate 43 in each sub-pixel are in an integrated structure in which they are connected with each other, connection between the anode 70 and the drain electrode of the second transistor T2 in each sub-pixel is achieved. In an exemplary embodiment, the four anodes 70 may form a red light emitting unit, a green light emitting unit, a blue light emitting unit and a white light emitting unit. In an exemplary embodiment, the four anodes 70 in the display area 100 may be rectangular, and the four anodes 70 are arranged in a square. The upper left anode 70 is connected with the third plate 43 of the first sub-pixel P1 through the thirteenth via hole V13 of the first sub-pixel P1, the upper right anode 70 is connected with the third plate 43 of the fourth sub-pixel P4 through the thirteenth via hole V13 of the fourth sub-pixel P4, the lower left anode 70 is connected with the third plate 43 of the second sub-pixel P2 through the thirteenth via hole V13 of the second sub-pixel P2, and the lower right anode 70 is connected with the third plate 43 of the third sub-pixel P3 through the thirteenth via hole V13 of the third sub-pixel P3. In some possible implementations, the four anodes 70 in the display area 100 may have an elongated shape, and the four anodes 70 are arranged in parallel, with each anode 70 corresponding to the position of the sub-pixel where the anode 70 is located. In some possible implementations, the arrangement of the anodes 70 in the display area 100 may be adjusted according to actual needs, which is not specifically limited here in the present disclosure.

After this patterning process, the transparent area 200 includes the first insulating layer 61 and the third insulating layer 63 stacked on the substrate 10, the auxiliary cathode 80 arranged on the third insulating layer 63, the fourth insulating layer 64 the flat layer 65 covering the auxiliary cathode 80, and the connection electrode 81 arranged on the flat layer 65. The connection electrode 81 is connected with the auxiliary cathode 80 through the fourteenth via hole V14.

Figure 17:
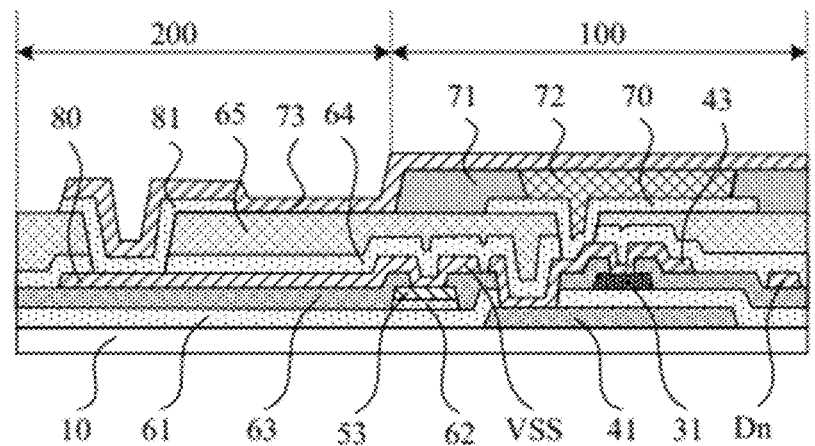
FIG. 17 is a schematic view after patterns of a pixel define layer are formed, an organic light emitting layer and a cathode according to the present disclosure.

(8) Forming patterns of a pixel define layer, an organic light emitting layer and a cathode, which includes: coating a pixel definition thin film on the substrate on which the above patterns are formed, and forming a pattern of a pixel define layer 71 through masking, exposure and development processes, the pixel define layer 71 being formed in each sub-pixel in the display area 100, and the pixel define layer 71 in each sub-pixel being formed with a pixel opening exposing the anode 70; then forming an organic light emitting layer 72 in the pixel opening formed above, the organic light emitting layer 72 being connected with the anode 70; and then depositing a cathode thin film, and patterning the cathode thin film by a patterning process to form a pattern of a cathode 73 in the display area 100 and the transparent area 200. In the display area 100, the cathode 73 is connected with the organic light emitting layer 72, and in the transparent area 200, the cathode 73 is connected with the connection electrode 81. Since the connection electrode 81 is connected with the auxiliary cathode 80, and the auxiliary cathode 80 is connected with the second power supply line VSS, connection between the cathode 73 and the second power supply line VSS is implemented, as shown in FIG. 17.

Figure 18:
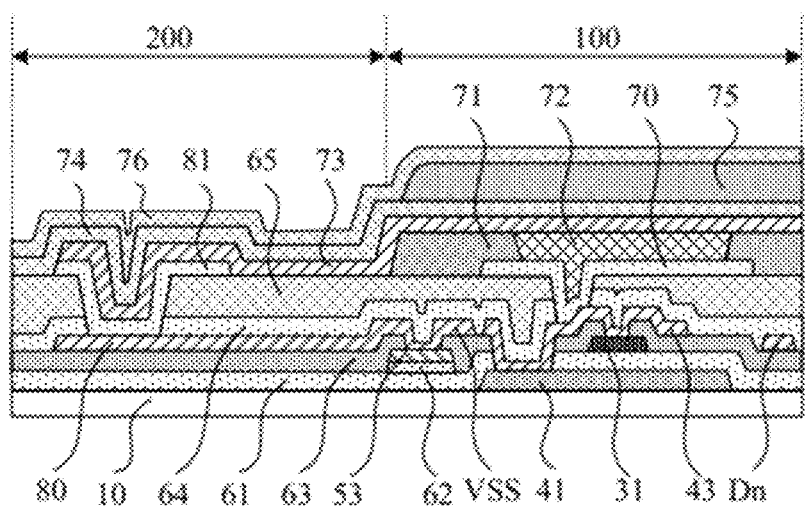
FIG. 18 is a schematic view after a pattern of an encapsulation layer is formed according to the present disclosure.

(9) An encapsulation layer is formed based on the above formed patterns, the encapsulation layer being formed in the display area 100 and the transparent area 200. The encapsulation layer of the display area 100 includes a first encapsulation layer 74 of an inorganic material, a second encapsulation layer 75 of an organic material and a third encapsulation layer 76 of an inorganic material. The first encapsulation layer 74 is arranged on the cathode 73, the second encapsulation layer 75 is arranged on the first encapsulation layer 74, and the third encapsulation layer 76 is arranged on the second encapsulation layer 75, thereby forming an inorganic material/organic material/inorganic material stacked structure. The encapsulation layer of the transparent area 200 includes the first encapsulation layer 74 of an inorganic material and the third encapsulation layer 76 of an inorganic material. The first encapsulation layer 74 is arranged on the cathode 73 and the third encapsulation layer 76 is arranged on the first encapsulation layer 74, thereby forming an inorganic material/inorganic material stacked structure, as shown in FIG. 18.

Referring to FIGS. 3-18, in each sub-pixel, the first active layer 11, the first gate electrode 12, the first source electrode 13 and the first drain electrode 14 constitute the first transistor T1; the second active layer 21, the second gate electrode 22, the second source electrode 23 and the second drain electrode 24 constitute the second transistor T2; the third active layer 31, the third gate electrode 32, the third source electrode 33 and the third drain electrode 34 constitute the third transistor T3; the first plate 41 and the second plate 42 constitute the first storage capacitor; and the second plate 42 and the third plate 43 constitute the second storage capacitor. The first storage capacitor and the second storage capacitor are in a parallel structure, implementing the storage of the potential of the second gate electrode 22 of the sub-pixel in which the first storage capacitor and the second storage capacitor are located. The first transistors T1, the second transistors T2, the third transistors T3, the first storage capacitors and the second storage capacitors in the first sub-pixel P1 and the fourth sub-pixel P4 are respectively mirror symmetric with respect to the compensation line Se; and the first transistors T1, the second transistors T2, the third transistors T3, the first storage capacitors and the second storage capacitors in the second sub-pixel P2 and the third sub-pixel P3 are respectively mirror symmetric with respect to the compensation line Se.

In each sub-pixel, the first gate electrode 12 is connected with the first scanning line Gn, the first source electrode 13 is connected with the data line Dn, and the first drain electrode 14 is connected with the second gate electrode 22 of the sub-pixel. The second gate electrode 22 is connected with the first drain electrode 14 of the sub-pixel in which the second gate electrode 22 is located, the second source electrode 23 is connected with the first power supply line VDD through the power supply connection line 52, and the second drain electrode 24 is connected with the anode of the sub-pixel in which the second drain electrode 24 is located. The third gate electrode 32 is connected with the second scanning line Sn, the third source electrode 33 is connected with the compensation line Se through the compensation connection line 51, and the third drain electrode 34 is connected with the second drain electrode 24 of the sub-pixel in which the third drain electrode 34 is located. The first plate 41 is connected with the second drain electrode 24 and the third drain electrode 34 of the sub-pixel in which the first plate 41 is located, the second plate 42 is connected with the second gate electrode 22 and the first drain electrode 14 of the sub-pixel in which the second plate 42 is located, and the third plate 43 is connected with the second drain electrode 24 and the third drain electrode 34 of the sub-pixel in which the third plate 43 is located. The anode 70 is connected with the second drain electrode 24 of the sub-pixel in which the anode 70 is located, and the cathode 73 covering all sub-pixels is connected with the second power supply line VSS through the auxiliary cathode 80 of the transparent area 200, so that the organic light emitting layer 72 between the anode 70 and the cathode 73 emits light with corresponding brightness in response to the current of the second drain electrode 24 of the sub-pixel in which the organic light emitting layer 72 is located.

In an exemplary embodiment, the first metal layer, the second metal layer and the third metal layer may be made of metal materials, such as any one or more of silver (Ag), copper (Cu), aluminum (Al) and molybdenum (Mo), or alloy materials of the above metals, such as aluminum neodymium alloy (AlNd) or molybdenum niobium alloy (MoNb), which may be a single-layer structure or a multilayer composite structure, such as Mo/Cu/Mo. The first insulating layer, the second insulating layer, the third insulating layer and the fourth insulating layer may be made of any one or more of silicon oxide (SiOx), silicon nitride (SiNx) and silicon oxynitride (SiON), which may be a single layer, multiple layers or a composite layer. The first insulating layer is called a buffer layer, which is used for improving a capability of water and oxygen resistance of the substrate, the second insulating layer is called a gate insulating (GI) layer, the third insulating layer is called an interlayer dielectric (ILD) layer, and the fourth insulating layer is called a passivation (PVX) layer. The thickness of the second insulating layer is smaller than the thickness of the third insulating layer, and the thickness of the first insulating layer is smaller than the sum of the thicknesses of the second insulating layer and the thicknesses of the third insulating layer, which increases the capacity of the storage capacitor, while ensuring the insulating effect. The flat layer may be made of an organic material, the transparent conductive thin film may be made of indium tin oxide (ITO) or indium zinc oxide (IZO), and the pixel define layer may be made of polyimide, acrylic or polyethylene terephthalate. The cathode may be made of any one or more of magnesium (Mg), silver (Ag), aluminum (Al), copper (Cu) and lithium (Li), or an alloy made of any one or more of the above metals.

In some possible implementations, the first insulating layer has a thickness of 3000 angstroms to 5000 angstroms, the second insulating layer has a thickness of 1000 angstroms to 2000 angstroms, the third insulating layer has a thickness of 4500 angstroms to 7000 angstroms, and the fourth insulating layer has a thickness of 3000 angstroms to 5000 angstroms. The first metal layer has a thickness of 80 angstroms to 1200 angstroms, the second metal layer has a thickness of 3000 angstroms to 5000 angstroms, and the third metal layer has a thickness of 3000 angstroms to 9000 angstroms.

In an exemplary embodiment, the semiconductor layer may be made of oxides containing indium and tin, oxides containing tungsten and indium, oxides containing tungsten, indium and zinc, oxides containing titanium and indium, oxides containing titanium, indium and tin, oxides containing indium and zinc, oxides containing silicon, indium and tin, oxides containing indium, gallium and zinc, etc. The semiconductor layer may be a single layer, two layers, or multiple layers.

As shown in FIGS. 3 to 18, the display substrate according to the present disclosure includes: a substrate 10; a first metal layer arranged on the substrate 10, the first metal layer including a first plate 41 and a compensation connection line 51; a first insulating layer 61 covering the first metal layer;

a semiconductor layer arranged on the first insulating layer 61, the semiconductor layer including a first active layer 11, a second active layer 21, a third active layer 31 and a second plate 42, there being an overlapping area between the orthographic projection of the second plate 42 on the substrate 10 and the orthographic projection of the first plate 41 on the substrate 10, and the second plate 42 and the first plate 41 forming a first storage capacitor;

a second insulating layer 62 and a second metal layer arranged on the second insulating layer 62, the second metal layer including: a first scanning line Gn, a second scanning line Sn, a power supply connection line 52, an auxiliary power supply line 53, a first gate electrode 12, a second gate electrode 22 and a third gate electrode 32, the first gate electrode 12 and the first scanning line Gn being in an integrated structure, the third gate electrode 32 and the second scanning line Sn being in an integrated structure, and the second insulating layer 62 having the same pattern as the second metal layer;

a third insulating layer 63 covering the second metal layer, the third insulating layer 63 being provided with a plurality of via holes, including: a first via hole V1 and a second via hole V2 exposing both ends of the first active layer 11, a third via hole V3 and a fourth via hole V4 exposing both ends of the second active layer 21, a fifth via hole V5 and a sixth via hole V6 exposing both ends of the third active layer 31, a seventh via hole V7 and an eighth via hole V8 exposing the compensation connection line 51, a ninth via hole V9 exposing the second gate electrode 22 and the second plate 42 simultaneously, a tenth via hole V10 exposing the first plate 41, a plurality of eleventh via holes V11 exposing the power supply connection line 52, and a plurality of twelfth via holes V12 exposing the auxiliary power supply line 53;

a third metal layer arranged on the third insulating layer 63, the third metal layer including a first power supply line VDD, a second power supply line VSS, a compensation line Se, data lines Dn, a first source electrode 13, a first drain electrode 14, a second source electrode 23, a second drain electrode 24, a third source electrode 33, a third drain electrode 34 and a third plate 43, the first power supply line VDD being connected with the power supply connection line 52 through the eleventh via hole V11, the second power supply line VSS being connected with the auxiliary power supply line 53 through the twelfth via hole V12, the compensation line Se being connected with the compensation connection line 51 through the seventh via hole V7, the first source electrode 13 and the data line Dn being in an integrated structure, the second source electrode 23 being connected with the power supply connection line 52 through the third via hole V3, the third source electrode 33 being connected with the compensation connection line 51 through the eighth via hole V8, the first drain electrode 14 being simultaneously connected with the second gate electrode 22 and the second plate 42 through the ninth via hole V9, the second drain electrode 24, the third drain electrode 34 and the third plate 43 being in an integrated structure in which they are connected with each other, the third plate 43 being connected with the first plate 41 through the tenth via hole V10, there being an overlapping area between the orthographic projection of the third plate 43 on the substrate 10 and the orthographic projection of the second plate 42 on the substrate 10, and the second plate 42 and the third plate 43 forming a second storage capacitor;

a fourth insulating layer 64 and a flat layer 65 covering the third metal layer, the fourth insulating layer 64 and the flat layer 65 being respectively provided with a plurality of via holes, including: a thirteenth via hole V13 exposing the drain electrode of the second transistor and a fourteenth via hole V14 exposing an auxiliary cathode 80; a transparent conductive layer arranged on the flat layer 65, the transparent conductive layer including patterns of an anode 70 and a connection electrode 81, the anode 70 being connected with the drain electrode of the second transistor through the thirteenth via hole V13, and the connection electrode 81 being connected with the auxiliary cathode 80 through the fourteenth via hole V14; a pixel define layer 71 arranged on the flat layer 65, the pixel define layer 71 defining a pixel opening exposing the anode 70 in each sub-pixel; an organic light emitting layer 72 arranged in the opening area, the organic light emitting layer 72 being connected with the anode 70; a cathode 73, the cathode 73 in the display area 100 being connected with the organic light emitting layer 72 and the cathode 73 in the transparent area 200 being connected with the auxiliary cathode 80 through the connection electrode 81; and an encapsulation layer 74 covering the above structure.

The structure shown in the present disclosure and the preparation process thereof are merely an exemplary description. In an exemplary embodiment, corresponding structures may be changed and patterning processes may be added or reduced according to actual needs. For example, the display area may include 3 sub-pixels. In another example, the pixel driving circuit may be 5T1C or 7T1C. In a further example, other electrodes or leads may also be arranged in the film structure, which is not specifically limited here in the present disclosure.

It can be seen from the above-described structure and preparation flow of the display substrate that in the display substrate according to the present disclosure, an auxiliary cathode is arranged in the transparent area to change the transparent area into an irregular shape, when light passes through the irregular transparent area, as diffraction fringes are generated at different positions and in different directions, the diffraction fringes generated by light will not spread in one direction but in multiple directions, thus greatly weakening the diffraction effect, avoiding blurring of objects behind the screen and improving the effect of transparent display. Simulation results show that when the auxiliary cathode is not provided, the diffraction value of the display substrate is 50%, and four serious diffraction spots are generated around the center point; and after the auxiliary cathode is provided, the diffraction value of the display substrate is 30%, and four slight diffraction spots are generated around the center point. In the display substrate according to the present disclosure, by arranging an auxiliary cathode connected with the cathode of the light emitting element in the transparent area, the voltage drop of large-size transparent display can be effectively alleviated, which ensures uniformity of display, is beneficial to simplifying the structural layout of the display area, reducing the space occupied by each sub-pixel, improving the area ratio of the transparent area, and improving the resolution and transparency. In the display substrate according to the present disclosure, the second plate of a metal oxide material is used as a plate of the storage capacitor, the second plate forms storage capacitors with the first plate in the first metal layer and with the third plate in the third metal layer respectively. The first plate and the third plate have the same potential, and the second plate has a different potential from the first plate and the third plate. Therefore, two parallel storage capacitors are formed between the first plate, the second plate and the third plate, which effectively increases the capacity of the storage capacitors and is beneficial to implementing high-resolution display. The preparation process of the present disclosure may be achieved by using the existing mature preparation equipment, has small improvements to the existing process, can be well compatible with the existing preparation process, is simple in process implementation, is easy to practice, and has high production efficiency, low production cost and high yield.

Figure 19:
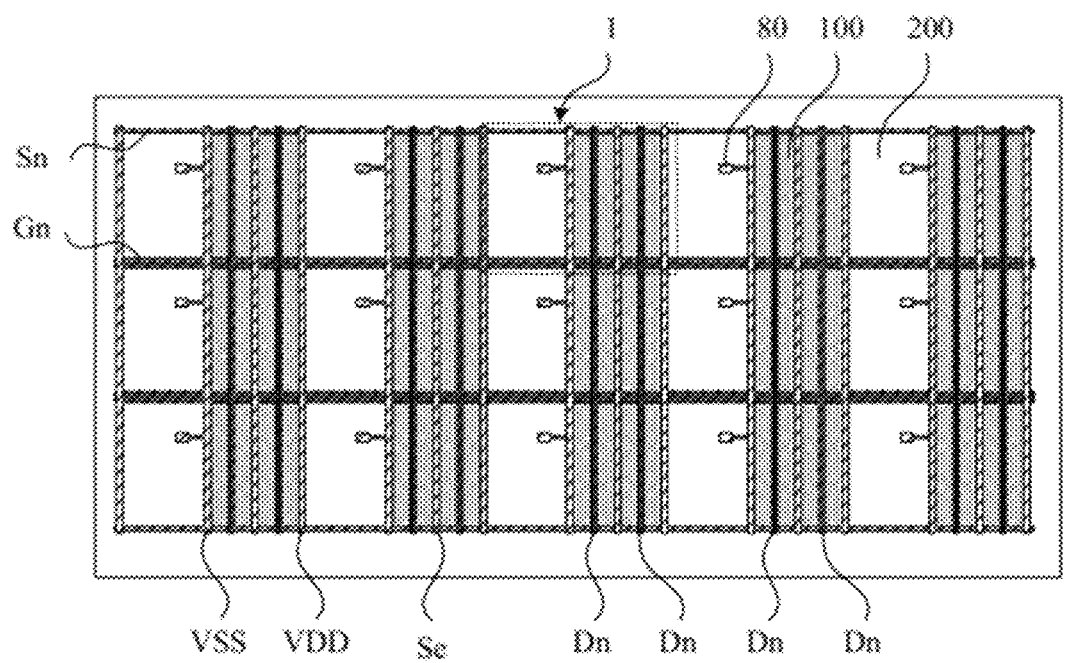
FIG. 19 is a schematic plan view of a display substrate according to the present disclosure.

FIG. 19 is a schematic plan view of a display substrate according to the present disclosure. As shown in FIG. 19, the display substrate of the present disclosure includes a plurality of display units 1 arranged regularly. Each display unit 1 includes a display area 100 and a transparent area 200. The transparent area 200 is arranged on a side of the display area 100, and an auxiliary cathode 80 is arranged in the transparent area 200. The display area 100 is configured to implement image display, and the transparent area 200 is configured to allow light to pass through, thereby implementing transparent display. The display substrate includes a plurality of first scanning lines Gn and second scanning lines Sn arranged horizontally and a plurality of first power supply lines VDD and second power supply lines VSS arranged vertically. One sub-pixel row is defined between the first scanning line Gn and the second scanning line Sn, and four sub-pixel columns are defined between the first power supply line VDD and the second power supply line VSS. One sub-pixel row and four sub-pixel columns constitute four sub-pixels provided with a pixel driving circuit, and the four sub-pixels are arranged in parallel. The display substrate further includes a plurality of compensation lines Se and data lines Dn arranged vertically. The compensation line Se is arranged between the first power supply line VDD and the second power supply line VSS, two data lines Dn are arranged between the second power supply line VSS and the compensation line Se, and the other two data lines Dn are arranged between the first power supply line VDD and the compensation line Se. The four sub-pixels in one display area include: a first sub-pixel defined by the second power supply line VSS and the data line Dn, a second sub-pixel defined by the data line Dn and the compensation line Se, a third sub-pixel defined by the compensation line Se and the data line Dn, and a fourth sub-pixel defined by the data line Dn and the first power supply line VDD. The transparent area 200 is defined by the first scanning line Gn, the second scanning line Sn, the first power supply line VDD and the second power supply line VSS, and includes the auxiliary cathode 80 which is configured to reduce the diffraction effect of the transparent area, and also configured to provide a low-level signal to the cathode of the light emitting element in the display area 100. In the present disclosure, the auxiliary cathode 80 is arranged in the transparent area 200 to change the transparent area into an irregular shape, and when light passes through the irregular transparent area, as diffraction fringes are generated at different positions and in different directions, the diffraction fringes generated by light will not spread in one direction but in multiple directions, thus greatly weakening the diffraction effect, avoiding blurring of objects behind the screen and improving the effect of transparent display. In the present disclosure, the auxiliary cathode 80 is arranged in the transparent area 200, and the auxiliary cathode 80 is connected with the cathode of the light emitting element, which can effectively alleviate the IR Drop of the large-size transparent display, ensuring uniformity of display. The auxiliary cathode 80 is arranged in the transparent area 200, which is beneficial to simplifying the structural layout of the display area, reducing the space occupied by each sub-pixel, improving the area ratio of the transparent area, and improving the resolution and transparency.

Figure 20:
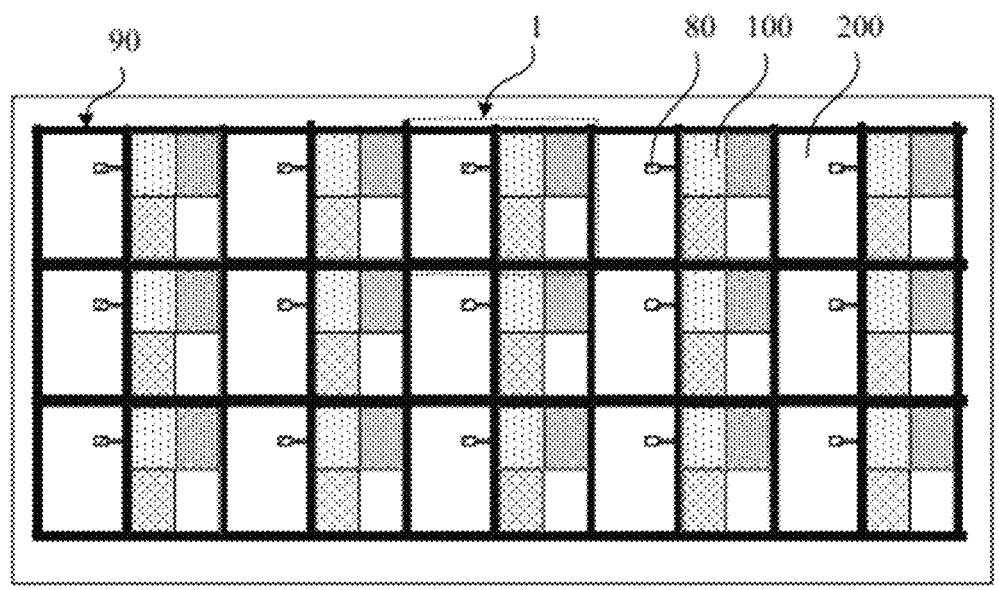
FIG. 20 is a schematic view of another structure of a display substrate according to the present disclosure.

FIG. 20 is a schematic view of another structure of a display substrate according to the present disclosure. In an exemplary embodiment, the display substrate further includes a shielding strip 90. The shielding strip 90 is arranged at an edge of the display area 100, at an edge of the transparent area 200, or at edges of the display area 100 and the transparent area 200, and is configured to reduce the reflection phenomenon and diffraction effect of the display area.

Figure 21:
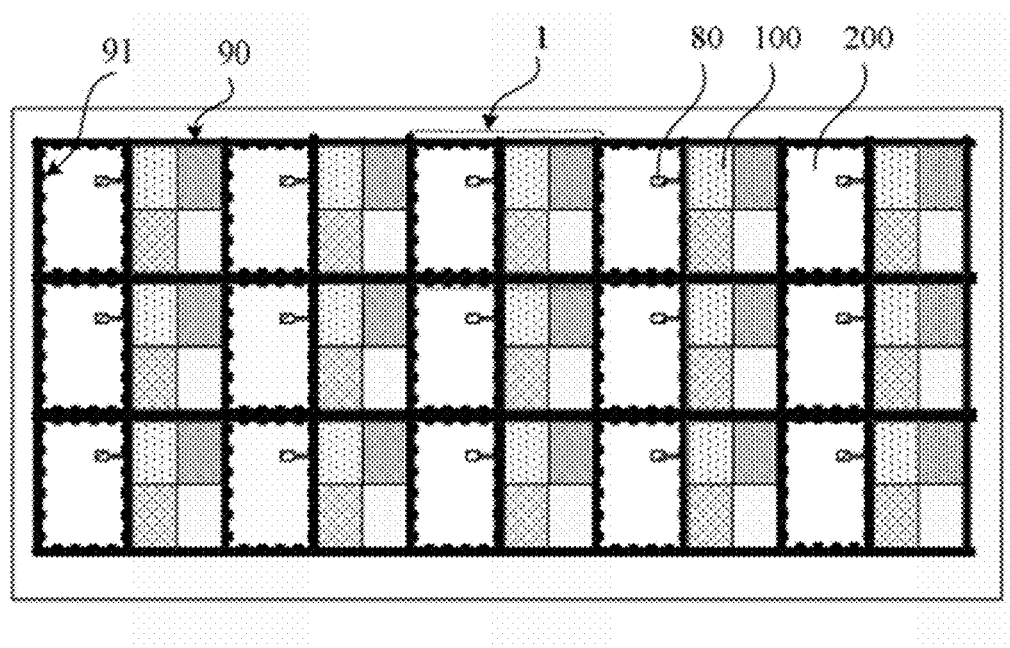
FIG. 21 is a schematic view of a further structure of a display substrate according to the present disclosure.

The display area 100 and the transparent area 200 are provided with a plurality of signal lines. As these signal lines are made of metal materials, when external light is incident on the display area 100 and the transparent area 200, metal reflection occurs to the light incident on these metal signal lines, and complicated diffraction fringes also occur to light past these metal signal lines, resulting in serious reflection phenomenon and diffraction effect and reducing the effect of transparent display. In addition, the reflection phenomenon and diffraction effect will further reduce the imaging quality of a camera in a transparent display apparatus, causing distortion problems, such as blur, ghosting and colored edges, in the images captured by the camera. In the display substrate according to the present disclosure, by arranging the shielding strips 90 at the edges of the display area 100 and the transparent area 200, positioning the shielding strips 90 on the light path along which light is incident on the signal lines, and shielding the metal signal lines located at the edges of the display area 100 and the transparent area 200 using the shielding strips 90, light incident on or past the metal signal lines is reduced, thus effectively reducing the reflection phenomenon of the signal lines, effectively reducing the diffraction effect of the signal lines, improving the effect of transparent display, and improving the imaging quality of the camera FIG. 21 is a schematic view of a further structure of a display substrate according to the present disclosure. In an exemplary embodiment, the display substrate further includes a shielding strip 90 and a convex structure 91. The shielding strip 90 is arranged at the edges of the display area 100 and the transparent area 200, and the convex structure 91 is arranged at at least one edge of the transparent area 200. The shielding strip 90 is configured to reduce the reflection phenomenon and diffraction effect of the display area, and the convex structure 91 is configured to reduce the diffraction effect of the transparent area.

In an exemplary embodiment, the convex structure 91 may include a plurality of spaced-apart protrusions. One end of the plurality of protrusions is located on the inside edge of the transparent area 200, and the other end extends towards the middle of the transparent area 200, forming a transparent area 200 with a concave-convex inside edge. In an exemplary embodiment, the convex structure 91 may include a wavy shielding strip, forming a transparent area 200 with a wavy inside edge. In the present disclosure, a concave-convex or wavy inside edge is formed in the transparent area 200, and the concave-convex or wavy inside edge can generate diffraction fringes with different positions and different diffusion directions, which greatly weakens the diffraction effect, avoids blurring of objects behind the screen and improves the effect of transparent display. In an exemplary embodiment, other structures of the display substrate are similar to the corresponding structures described in the previous embodiments.

In some possible implementations, the position of the shielding strip 90 may correspond to the positions of the first scanning line Gn, the second scanning line Sn, the first power supply line VDD and the second power supply line VSS. The orthographic projection of the shielding strip 90 on the substrate may include the orthographic projections of the first scanning line Gn, the second scanning line Sn, the first power supply line VDD and the second power supply line VSS on the substrate. For the shielding strip 90, a black matrix (BM), or at least two color filter layers, for example, a red color filter layer and a blue color filter layer, which are stacked may be used.

In some possible implementations, the convex structure 91 may be arranged on one edge, two opposite edges, two adjacent edges, or all edges in the transparent area 200, so that the spacings between two edges at different positions are different, which is not specifically limited here in the present disclosure.

In some possible implementations, the shape of the protrusion may include any one or more of a circle, an ellipse, a rectangle, a trapezoid, a pentagon, a hexagon and a dumbbell shape. The shapes of the plurality of protrusions or waves may be the same or may be different. The sizes of the plurality of protrusions or waves may be the same or may be different, which is not specifically limited here in the present disclosure.

In some possible implementations, the convex structure 91 and the shielding strip 90 are arranged on the same layer and formed by the same process. In some possible implementations, the convex structure 91 is integrated with the shielding strip 90.

The present disclosure further provides a method for preparing a display substrate, the display substrate including a plurality of display units arranged regularly, the display unit including a display area and a transparent area, and the display area including a plurality of sub-pixels; the method includes steps of S1 and S2:

In S1, a first metal layer, a semiconductor layer and a second metal layer on a substrate are formed; the first metal layer including a first plate, the semiconductor layer including a second plate, there being an overlapping area between an orthographic projection of the second plate on the substrate and an orthographic projection of the first plate on the substrate to form a first storage capacitor; the second metal layer including a first scanning line and a second scanning line which define a sub-pixel row; and In S2, a third metal layer is formed; the third metal layer including a third plate, and a first power supply line, a second power supply line, a compensation line and data lines which define the plurality of sub-pixels; there being an overlapping area between an orthographic projection of the third plate on the substrate and an orthographic projection of the second plate on the substrate to form a second storage capacitor, the third plate being connected with the first plate through a via hole; and the third metal layer further including at least one auxiliary cathode which is arranged in the transparent area and connected with the second power supply line.

In an exemplary embodiment, step S1 includes:
forming a first metal layer including a first plate and a compensation connection line on the substrate;
forming a first insulating layer covering the first metal layer, and forming a semiconductor layer including a second plate on the first insulating layer, there being an overlapping area between an orthographic projection of the second plate on the substrate and an orthographic projection of the first plate on the substrate to form a first storage capacitor; and
forming a second insulating layer and a second metal layer arranged on the second insulating layer, the second insulating layer having the same pattern as the second metal layer, and the second metal layer including a first scanning line, a second scanning line and a power supply connection line.

In an exemplary embodiment, step S2 includes:
forming a third insulating layer covering the second metal layer, the third insulating layer being formed with a plurality of via holes including: a seventh via hole exposing the compensation connection line, a tenth via hole exposing the first plate and an eleventh via hole exposing the power supply connection line; and
forming a third metal layer on the third insulating layer, the third metal layer including a third plate, a first power supply line, a second power supply line, a compensation line, data lines and at least one auxiliary cathode; there being an overlapping area between an orthographic projection of the third plate on the substrate and an orthographic projection of the second plate on the substrate to form a second storage capacitor, the third plate being connected with the first plate through the tenth via hole; the compensation line being connected with the compensation connection line through the seventh via hole, and the first power supply line being connected with the power supply connection line through the eleventh via hole; and the at least one auxiliary cathode being arranged in the transparent area and connected with the second power supply line.

In an exemplary embodiment, the preparation method further includes:
forming a fourth insulating layer and a flat layer covering the third metal layer;
forming an anode and a connection electrode on the flat layer, the anode being connected with the third plate, and the connection electrode being connected with the auxiliary cathode;
sequentially forming a pixel define layer, an organic light emitting layer, a cathode and an encapsulation layer, the cathode being connected with the connection electrode; and
forming a shielding strip on the encapsulation layer, an orthographic projection of the shielding strip on the substrate including orthographic projections of the first scanning line, the second scanning line, the first power supply line and the second power supply line on the substrate.

In an exemplary embodiment, forming a shielding strip on the encapsulation layer includes:
forming a shielding strip and a convex structure on the encapsulation layer, the convex structure being arranged on an inner side of an edge of the transparent area and including a wavy shielding strip or a plurality of spaced-apart protrusions, to form a transparent area with a concave-convex inside edge or a transparent area with a wavy inside edge.

The present disclosure further provides a display apparatus, including the display substrate according to the aforementioned embodiments. The display apparatus may be any product or component with a display function such as a mobile phone, a tablet computer, a television, a display, a notebook computer, a digital photo frame, a navigator, etc.

The drawings in the present disclosure only refer to the structures involved in the present disclosure, and common designs may be referred to for other structures. Without conflict, the embodiments of the present disclosure, i.e., the features in the embodiments, may be combined with each other to obtain a new embodiment.

Those of ordinary skills in the art will appreciate that modifications or equivalent substitutions may be made to the technical solutions of the present disclosure without departing from the spirit and scope of the technical solutions of the present disclosure, all of which should be contained within the scope of the claims of the present disclosure.

What is claimed is:
1. A display substrate, comprising:
a plurality of display units,
wherein a display unit of the plurality of display units comprises a display area and a transparent area, the display area comprises a plurality of sub-pixels; in a direction perpendicular to the display substrate, a sub-pixel comprises a first metal layer, a semiconductor layer, a second metal layer and a third metal layer which are arranged on the substrate, the first metal layer comprises a first plate, the semiconductor layer comprises a second plate, the second metal layer comprises a first scanning line and a second scanning line which define a sub-pixel row, and the third metal layer comprises a third plate, and a first power supply line, a second power supply line, a compensation line and data lines which define the plurality of sub-pixels; there is an overlapping area between an orthographic projection of the second plate on the substrate and an orthographic projection of the first plate on the substrate to form a first storage capacitor, there is an overlapping area between an orthographic projection of the third plate on the substrate and the orthographic projection of the second plate on the substrate to form a second storage capacitor, the third plate is connected with the first plate through a via hole; and the third metal layer further comprises at least one auxiliary cathode which is arranged in the transparent area and connected with the second power supply line.

2. The display substrate according to claim 1, wherein the display area comprises a first sub-pixel, a second sub-pixel, a third sub-pixel and a fourth sub-pixel which are provided with a pixel driving circuit, and the four sub-pixels are arranged in parallel.

3. The display substrate according to claim 2, wherein at least one of the first metal layers and the semiconductor layers of the first sub-pixel and the fourth sub-pixel are mirror symmetrically arranged with respect to the compensation line, and at least one of the first metal layers and the semiconductor layers of the second sub-pixel and the third sub-pixel are mirror symmetrically arranged with respect to the compensation line.

4. The display substrate according to claim 2, wherein the pixel driving circuit comprises a first transistor, a second transistor, a third transistor and a storage capacitor, a gate electrode of the first transistor is connected with the first scanning line, a first electrode of the first transistor is connected with the data lines, a second electrode of the first transistor is connected with a gate electrode of the second transistor, a first electrode of the second transistor is connected with the first power supply line, a second electrode of the second transistor is connected with a first electrode of an organic electroluminescent diode, a gate electrode of the third transistor is connected with the second scanning line, a first electrode of the third transistor is connected with the compensation line through a compensation connection line, a second electrode of the third transistor is connected with the second electrode of the second transistor, a second electrode of the organic electroluminescent diode is connected with the second power supply line, the first plate and the third plate are connected with the second electrode of the second transistor, and the second plate is connected with the gate electrode of the second transistor.

5. The display substrate according to claim 4, wherein the pixel driving circuit further comprises a power supply connection line, the first electrode of the second transistor is connected with the first power supply line through the power supply connection line; the power supply connection line is arranged on a same layer as the first scanning line and the second scanning line, and the first power supply line is connected with the power supply connection line through a via hole, to form a double-layer routing between the gate electrode of the first transistor and the gate electrode of the third transistor.

6. The display substrate according to claim 4, wherein the pixel driving circuit further comprises an auxiliary power supply line which is arranged on the same layer as the first scanning line and the second scanning line, and the second power supply line is connected with the auxiliary power supply line through a via hole, to form a double-layer routing between the gate electrode of the first transistor and the gate electrode of the third transistor.

7. The display substrate according to claim 4, wherein the semiconductor layer further comprises an active layer of the first transistor, an active layer of the second transistor and an active layer of the third transistor, the compensation connection line is arranged on a same layer as the first plate, and the second plate is arranged on a same layer as the active layer of the first transistor, the active layer of the second transistor and the active layer of the third transistor.

8. The display substrate according to claim 4, wherein the first plate serves as a shielding layer, a shape of the first plate comprises an elongated rectangular shape, and in a direction parallel to the compensation line, a length of the first plate is greater than a distance between the gate electrode of the first transistor and the gate electrode of the third transistor.

9. The display substrate according to claim 1, wherein the auxiliary cathode comprises an electrode block and a connection strip, the electrode block is connected with the second power supply line through the connection strip, and an area of the electrode block is 5% to 20% of an area of the transparent area.

10. The display substrate according to claim 9, wherein in a plane parallel to the display substrate, a shape of the electrode block comprises any one or more of a circle, an ellipse, a rectangle, a trapezoid, a pentagon, a hexagon and a dumbbell shape, and the connection strip comprises any one or more of a straight strip, a zigzag strip and an arcuate strip.

11. The display substrate according to claim 1, wherein the display substrate further comprises a shielding strip, and an orthographic projection of the shielding strip on the substrate comprises orthographic projections of the first scanning line, the second scanning line, the first power supply line and the second power supply line on the substrate.

12. The display substrate according to claim 11, wherein the display substrate further comprises a convex structure, and the convex structure is arranged on an inner side of an edge of the transparent area and comprises a wavy shielding strip or a plurality of spaced-apart protrusions, to form the transparent area with a concave-convex inside edge or the transparent area with a wavy inside edge.

13. The display substrate according to claim 12, wherein in a plane parallel to the display substrate, a shape of the protrusions comprises any one or more of a circle, an ellipse, a rectangle, a trapezoid, a pentagon, a hexagon and a dumbbell shape.

14. The display substrate according to claim 12, wherein the convex structure is arranged on a same layer as the shielding strip.

15. A method for preparing a display substrate,
wherein the display substrate comprises a plurality of display units, a display unit of the plurality of display units comprises a display area and a transparent area, and the display area comprises a plurality of sub-pixels; the method comprises:
forming a first metal layer, a semiconductor layer and a second metal layer on a substrate, wherein the first metal layer comprises a first plate, the semiconductor layer comprises a second plate, there is an overlapping area between an orthographic projection of the second plate on the substrate and an orthographic projection of the first plate on the substrate to form a first storage capacitor; the second metal layer comprises a first scanning line and a second scanning line which define a sub-pixel row;
forming a third metal layer, wherein the third metal layer comprises a third plate, and a first power supply line, a second power supply line, a compensation line and data lines which define the plurality of sub-pixels; there is an overlapping area between an orthographic projection of the third plate on the substrate and an orthographic projection of the second plate on the substrate to form a second storage capacitor, the third plate is connected with the first plate through a via hole; and the third metal layer further comprises at least one auxiliary cathode which is arranged in the transparent area and connected with the second power supply line.

16. The method according to claim 15, wherein forming the first metal layer, the semiconductor layer and the second metal layer on a substrate comprises:
    forming the first metal layer comprising the first plate and a compensation connection line on the substrate;
    forming a first insulating layer covering the first metal layer, and forming the semiconductor layer comprising the second plate on the first insulating layer; and
    forming a second insulating layer and the second metal layer arranged on the second insulating layer, wherein a pattern of the second insulating layer is the same as a pattern as the second metal layer, and the second metal layer comprises the first scanning line, the second scanning line and a power supply connection line.

17. The method according to claim 16, wherein forming the third metal layer comprises:
    forming a third insulating layer covering the second metal layer, wherein the third insulating layer is formed with a plurality of via holes comprising a seventh via hole exposing the compensation connection line, a tenth via hole exposing the first plate and an eleventh via hole exposing the power supply connection line; and
    forming the third metal layer on the third insulating layer, wherein the third plate is connected with the first plate through the tenth via hole; the compensation line is connected with the compensation connection line through the seventh via hole, and the first power supply line is connected with the power supply connection line through the eleventh via hole.

18. The method according to claim 15, wherein the method further comprises:
    forming a fourth insulating layer and a flat layer covering the third metal layer;
    forming an anode and a connection electrode on the flat layer, wherein the anode is connected with the third plate, and the connection electrode is connected with the auxiliary cathode;
    sequentially forming a pixel define layer, an organic light emitting layer, a cathode and an encapsulation layer, wherein the cathode is connected with the connection electrode; and
    forming a shielding strip on the encapsulation layer, wherein an orthographic projection of the shielding strip on the substrate comprises orthographic projections of the first scanning line, the second scanning line, the first power supply line and the second power supply line on the substrate.

19. The method according to claim 18, wherein forming the shielding strip on the encapsulation layer comprises:
    forming the shielding strip and a convex structure on the encapsulation layer, wherein the convex structure is arranged on an inner side of an edge of the transparent area and comprises a wavy shielding strip or a plurality of spaced-apart protrusions, to form the transparent area with a concave-convex inside edge or the transparent area with a wavy inside edge.

20. A display apparatus, comprising the display substrate according to claim 1.

* * * * *